United States Patent
Atwood et al.

(10) Patent No.: US 7,139,214 B2
(45) Date of Patent: Nov. 21, 2006

(54) SEMICONDUCTOR INTEGRATED CIRCUIT

(75) Inventors: Bryan Atwood, Tokyo (JP); Takao Watanabe, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/033,157

(22) Filed: Jan. 12, 2005

(65) Prior Publication Data

US 2005/0185474 A1   Aug. 25, 2005

(30) Foreign Application Priority Data

Feb. 24, 2004   (JP)  ............................. 2004-047508

(51) Int. Cl.
*G11C 8/00*   (2006.01)
(52) U.S. Cl. ............ 365/230.05; 365/149; 365/189.01
(58) Field of Classification Search ........... 365/230.05, 365/149, 189.01
See application file for complete search history.

(56) References Cited

U.S. PATENT DOCUMENTS

| | | | |
|---|---|---|---|
| 5,831,896 A * | 11/1998 | Lattimore et al. | 365/154 |
| 5,995,433 A * | 11/1999 | Liao | 365/222 |
| 6,452,834 B1 * | 9/2002 | Kengeri | 365/174 |
| 6,576,943 B1 | 6/2003 | Ishii et al. | 257/296 |
| 6,787,835 B1 | 9/2004 | Atwood et al. | 257/296 |
| 6,903,962 B1 * | 6/2005 | Nii | 365/156 |

FOREIGN PATENT DOCUMENTS

JP   2000-011642   1/2000

* cited by examiner

*Primary Examiner*—Richard Elms
*Assistant Examiner*—N Nguyen
(74) *Attorney, Agent, or Firm*—Miles & Stockbridge P.C.

(57) ABSTRACT

An apparatus and method to reduce, during standby time, electric power caused by the leakage current flowing through a storage transistor in a 3-transistor dynamic cell. Source electrodes of storage transistors in a plurality of 3-transistor dynamic cells constituting a memory array are connected, and a switch is provided between the source electrode and a power supply terminal. The leakage current during the standby time is interrupted by bringing the switch into a conducting state during the active time, and by bringing the switch into a nonconducting state during the standby time.

16 Claims, 15 Drawing Sheets

SEMICONDUCTOR INTEGRATED CIRCUIT

CLAIM OF PRIORITY

The present application claims priority from Japanese application JP 2004-047508 filed on Feb. 24, 2004, the content of which is hereby incorporated by reference into this application.

1. Field of the Invention

The present invention relates to a semiconductor integrated circuit, and more particularly to a semiconductor integrated circuit that uses a 3-transistor dynamic cell with little leakage current.

2. Background of the Invention

The 3-transistor dynamic cell, and semiconductor integrated circuits using it, are known for a long time. The 3-transistor dynamic cell has the advantages as follows: because the number of elements of the 3-transistor dynamic cell is smaller than that of a static cell that uses six transistors (hereinafter referred to as "6T cell"), the high density can be achieved; and in contrast to a 1-transistor dynamic cell (1T cell), the 3-transistor dynamic cell produces a gain at the time of reading, which enables high-speed operation.

As an example of documents about the 3-transistor cell (hereinafter referred to as "3T cell"), there is a patent document 1. This invention is intended to achieve the speedup of read operation by changing the potential of a source of a storage transistor Tr from 0 V to the minus potential at the time of reading a 3T cell.

In the meantime, what is disclosed in a patent document 2 is a transistor in which an extremely thin semiconductor is used for a channel and the leakage current is reduced by making use of a quantum mechanical confinement effect in a film thickness direction.

Patent document 1: Japanese Patent Laid-Open No. 2000-11642

Patent document 2: U.S. Pat. No. 6,576,943

SUMMARY OF THE INVENTION

In the above conventional examples, the speedup of read operation is taken into consideration. However, the standby power consumption is not considered.

The 3T cell was utilized so that high integration and high speed, which characterize the 3T cell, were made the most of. For this reason, a method for reducing the power consumption was seldom devised. Accordingly, the 3T cell was not suitable for such a field that required the low power consumption, in particular, the low standby power consumption, typified by, for example, mobile apparatuses.

In the 3T cell, at the time of read operation, an access transistor is brought into an ON state. As a result, an electric current flows in response to a state in which a storage transistor stays, either in an ON state or in an OFF state, which causes the potential of a read bit line to change. The read operation is performed by detecting this change. During the standby time, access transistors of all cells stay in the OFF state. Accordingly, regardless of a state of the storage transistor, an electric current flowing from the read bit line to a source electrode of the storage transistor is almost interrupted.

However, because the access transistor is a MOS transistor, even if the access transistor stays in the OFF state, the leakage current slightly flows. If the memory capacity reaches several mega bits, even if the leakage current of one cell is slight, the total amount of the current becomes large.

A problem to be solved by the present invention is to reduce the leakage current flowing in the 3T cell during the standby time.

Typical features of the present invention disclosed in this application concerned will be briefly outlined as below.

Source electrodes of storage transistors in a plurality of 3-transistor memory cells are connected, and a switch means is provided between the source electrode and the power supply. During the active time, the switch means is brought into a conducting state to bias the source electrode of the storage transistor to a desired voltage value. On the other hand, during the standby time, the switch means is turned OFF, and thereby a path of the leakage current flowing through a memory cell is interrupted.

Moreover, as a write transistor of the 3-transistor memory cell, a transistor formed of a film having a film thickness of about 5 nm or less in a channel area is used.

According to the present invention, in a semiconductor integrated circuit that includes a memory constituted of 3-transistor memory cells, it becomes possible to greatly reduce the electric power consumed during the standby state.

BRIEF DESCRIPTION OF THE DRAWINGS

FIGS. 13A and 3B are diagrams each illustrating, as an embodiment, a timing chart that shows operation of the embodiment in FIG. 7 in detail;

DETAILED DESCRIPTION OF THE INVENTION

Embodiments of the present invention will be described with reference to drawings as below.

Figure 1:
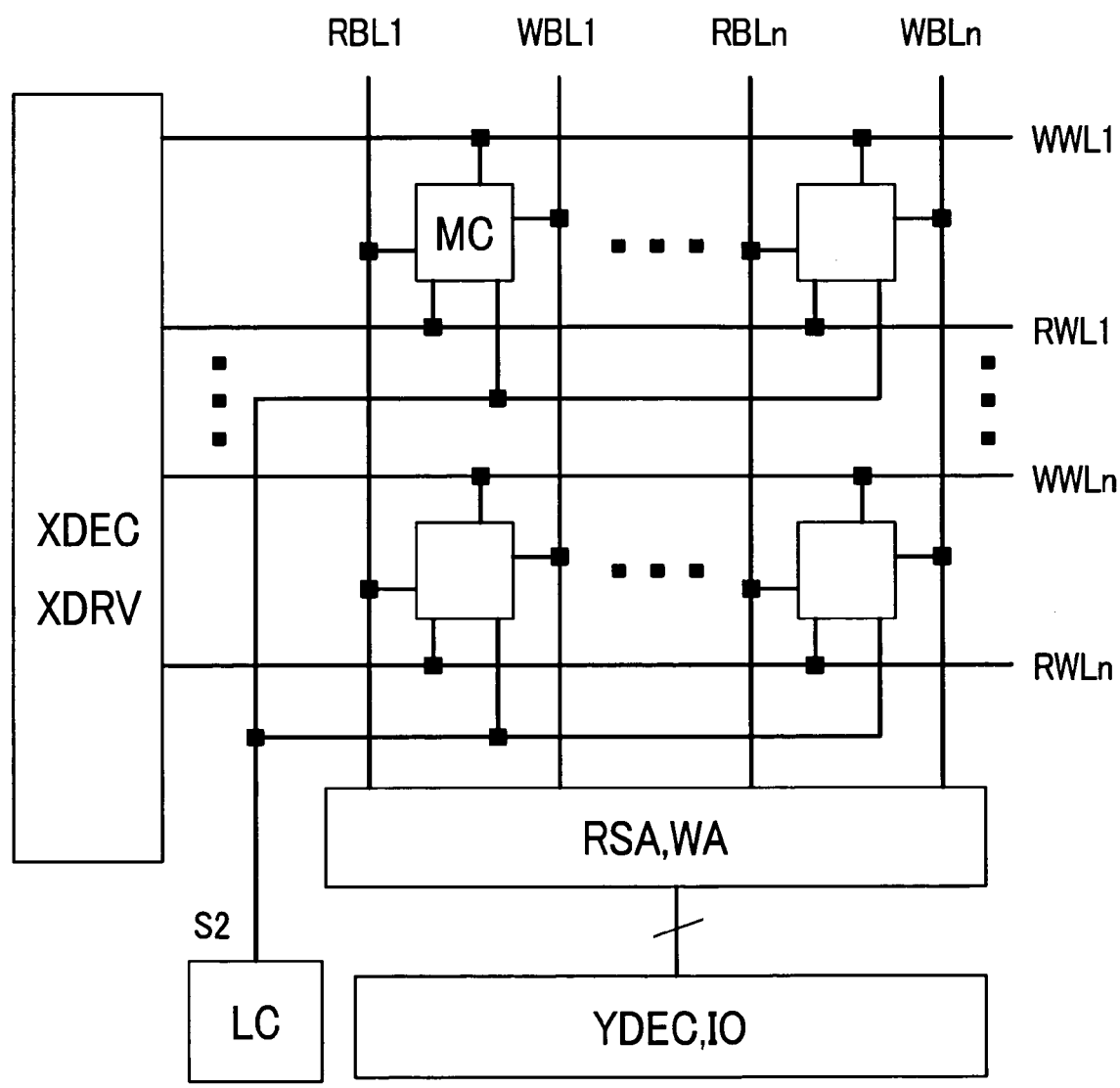
FIG. 1 is a diagram illustrating, as an embodiment, a basic configuration of a memory part of a semiconductor integrated circuit according to the present invention.
Figure 2:
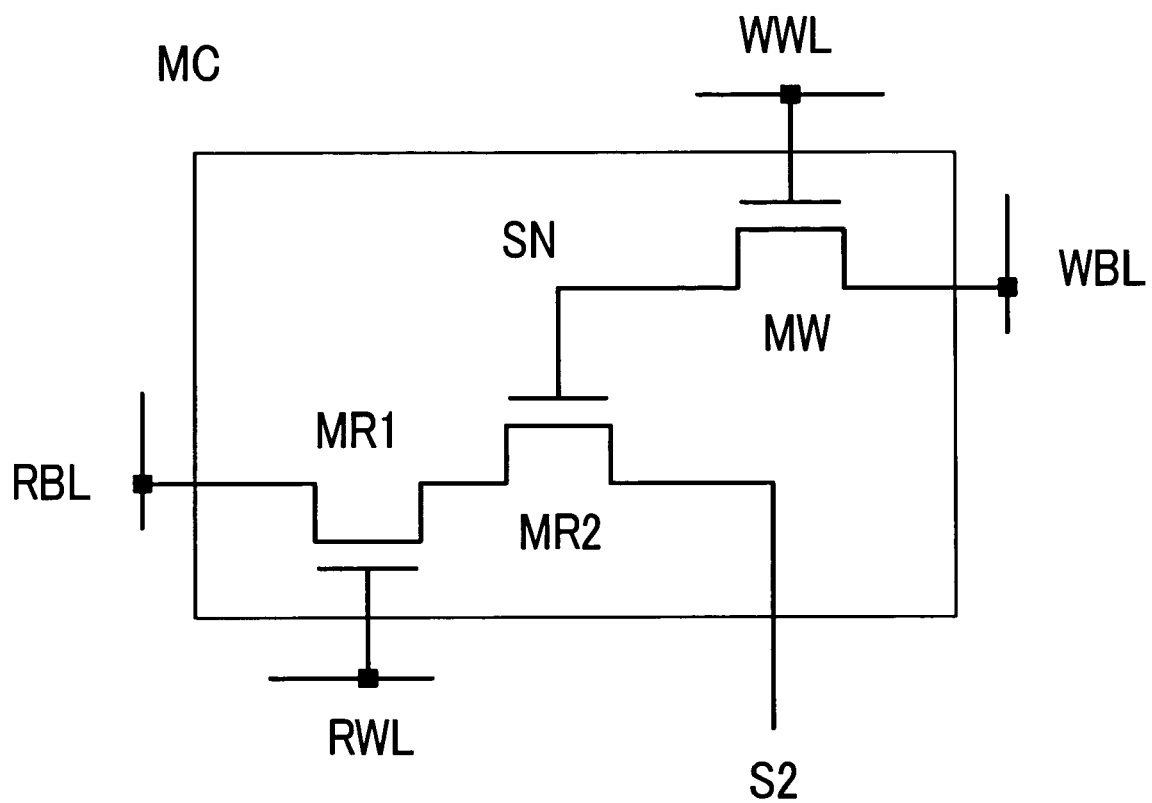
FIG. 2 is a diagram illustrating, as an embodiment, an equivalent circuit of a memory cell MC in the embodiment in FIG. 1.

FIG. 1 is a diagram illustrating a basic configuration of a memory formed of 3T cell MCs according to the present invention. FIG. 2 is a diagram illustrating a circuit configuration of each 3T cell MC.

As shown in FIG. 2, this cell MC comprises three transistors: an access transistor MR1; a storage transistor MR2; and a write transistor MW. A gate of the write transistor MW of the memory cell is connected to a write word line WWL; one of source/drain terminals of the write transistor MW is connected to a write bit line WBL; a gate of the access transistor MR1 is connected to a read word line RWL; one of source/drain terminals of the access transistor MR1 is connected to a read bit line RBL; the other of the source/drain terminals of the write transistor MW is connected to a gate electrode of the storage transistor MR2; and a drain of the storage transistor MR2 is connected to the other of the source/drain terminals of the access transistor MR1. All of the transistors used in the memory cell are N-channel transistors. FIG. 1 illustrates only a configuration of a memory array and circuits near the memory array. A refresh control circuit, a control pulse generation circuit, and the like, are omitted. Incidentally, although how the memory is configured is illustrated here, it is needless to say that the present invention can also be applied to a semiconductor integrated circuit that operates as a single memory, and to a semiconductor integrated circuit equipped with a microprocessor and a logical circuit as well as a memory.

In FIG. 1, the 3T cell MCs are two-dimensionally located. The read word line RWL, the write word line WWL, the read bit line RBL, and the write bit line WBL are connected to the 3T cell MCs. In addition, source electrodes S2 of the storage transistors MR2 of the plurality of memory cells, which are connected to the plurality of write bit lines and the plurality of write word lines, are connected to a leakage interruption circuit LC by common wiring.

The write word lines and the read word lines are selectively controlled by an X decoder XDEC and an X driver XDRV. The write and read word lines extend in a first direction. The read bit lines and the write bit lines extend in a second direction that intersects the first direction. In addition, a Y decoder and an input/output circuit 10 control: a write amplifier WA for driving the write bit lines to the potential corresponding to write information; and a sense amplifier SA for detecting and amplifying a signal read out from a read bit line. Because read/write operation in this embodiment is controlled in a manner similar to that of ordinary memories, the description thereof will be omitted. Here, leakage interruption will be described.

In an embodiment shown in FIG. 1, the source electrode S2 is connected to the leakage interruption circuit. Accordingly, it is possible to effectively interrupt the leakage current of all memory cells, for example, by: during the active time, keeping the potential of S2 at the ground potential with the leakage interruption circuit being kept in a low impedance state; and during the standby time, bringing LC into a high impedance state, which causes S2 to be kept in a floating state. It is to be noted that as shown in FIG. 2, even if the source electrode S2 of the storage transistor MR2 enters the floating state, stored information can be kept stored in the gate capacitance.

Figure 3:
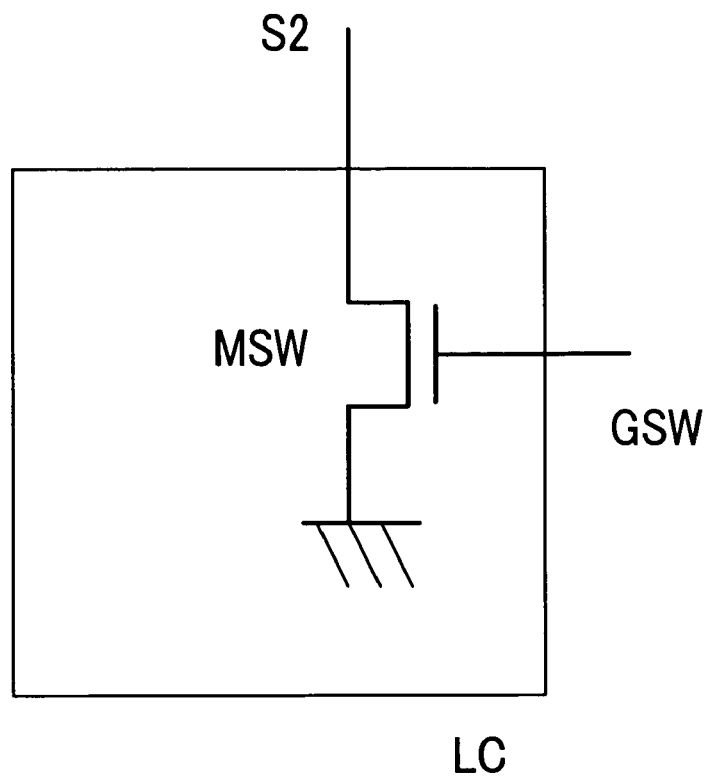
FIG. 3 is a diagram illustrating a first embodiment of a leakage current interruption circuit LC.
Figure 4:
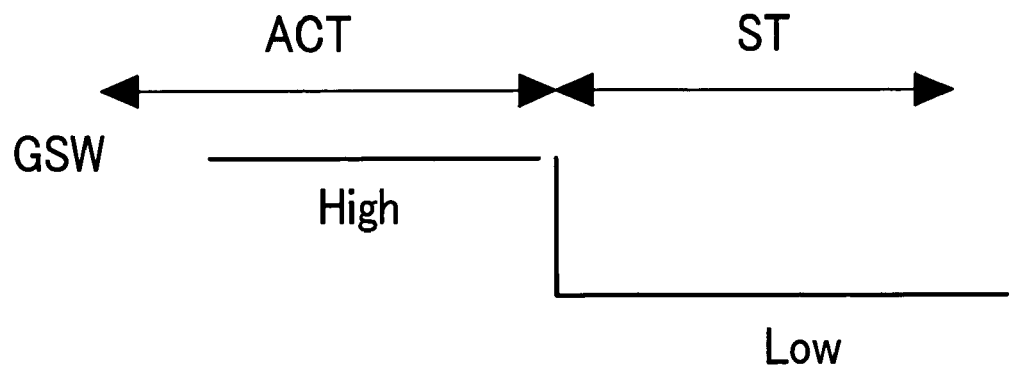
FIG. 4 is a diagram illustrating, as an embodiment, a timing chart of the embodiment in FIG. 3.

FIG. 3 is a diagram illustrating a specific embodiment of a leakage current interruption circuit LC. In FIG. 3, an N-channel MOS transistor MSW is made use of as the leakage current interruption circuit LC. A source electrode S2 of a 3T cell is connected to a drain of the transistor MSW; and the source potential of the transistor MSW is connected to the ground power supply. As a result, switching the potential of a gate electrode GSW of the transistor MSW makes it possible to control the impedance of the leakage current interruption circuit LC. FIG. 4 is a diagram illustrating an embodiment of a method for controlling the potential of the gate electrode GSW shown in the embodiment in FIG. 3. If the memory shown in FIG. 1 is in an active state ACT, the gate electrode GSW is driven to the high potential. If the memory is in a standby state ST, the gate electrode GSW is driven to the low potential. As a result, because the source electrode S2 becomes the ground potential in the active state, it is possible to perform read operation of the 3T cell. On the other hand, because in the standby state the source electrode S2 is kept in a floating state, it is possible to effectively interrupt the leakage current flowing through the source electrode S2 of the 3T cell. The size of the transistor MSW is determined so that an electric current required for reading can be sufficiently obtained in response to the number of 3T cells concurrently selected at the time of reading. According to the embodiments shown in FIGS. 3 and 4, the leakage current of the 3T cell can be effectively interrupted by use of a simple switch formed of a MOS transistor. Incidentally, because the 3T cell is a dynamic cell, refresh operation is required even during the standby time. The 3T cell is refreshed by temporarily reading information from the cell and then writing the information to the cell again. Therefore, even during the standby time, if the refresh operation is performed, the cell is refreshed with the leakage current interruption circuit LC being kept in a low impedance state. Although the leakage current flows during the refresh, it is only a short period of time. Accordingly, a standby current reduction effect is not lost. Additionally, although in the example described above the leakage current is interrupted only during the standby time, the leakage current may also be interrupted during the write operation if necessary. In this case, the power can be reduced when the memory stays in the active state.

Figure 5:
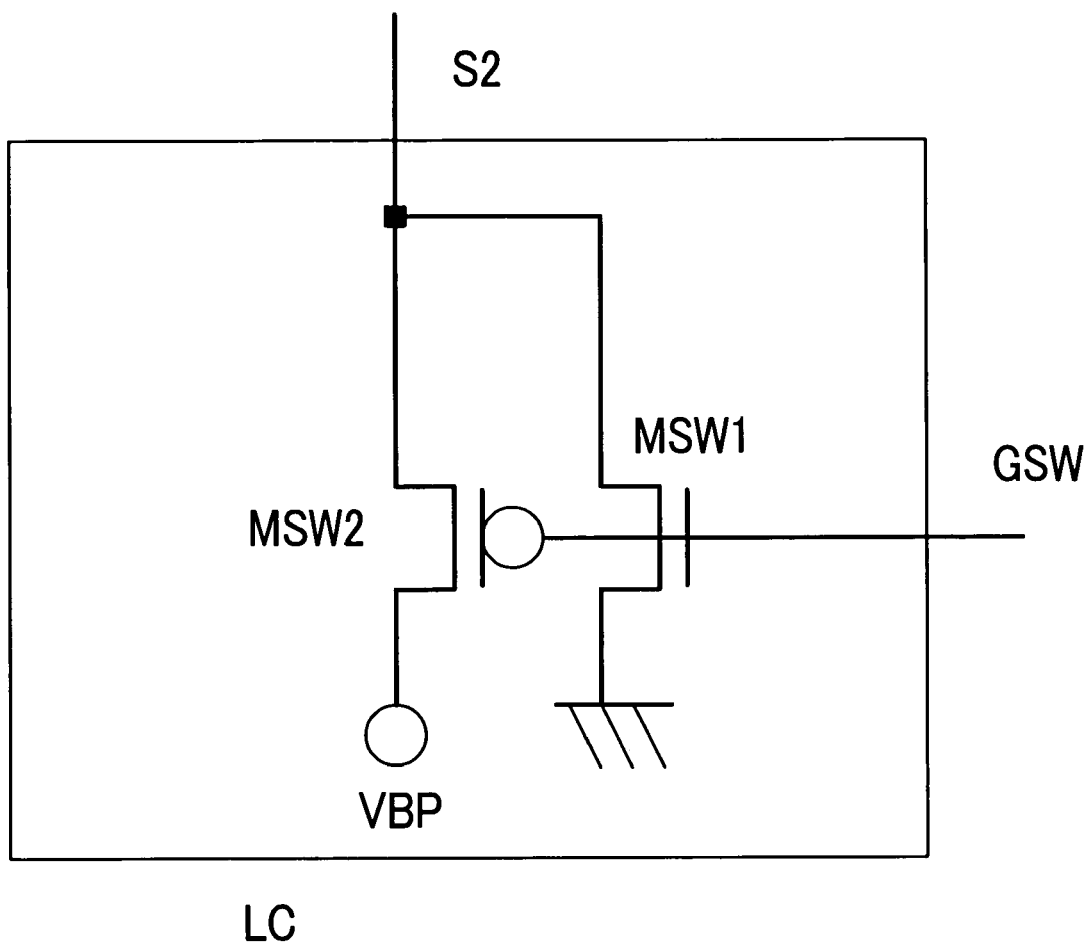
FIG. 5 is a diagram illustrating a second embodiment of a leakage current interruption circuit LC.
Figure 6:
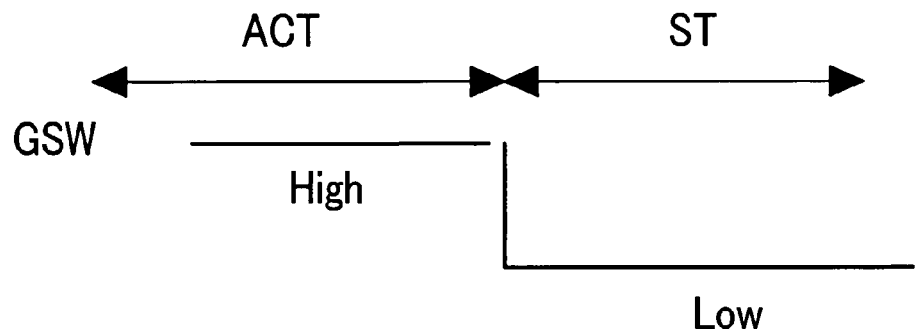
FIG. 6 is a diagram illustrating, as an embodiment, a timing chart of the embodiment in FIG. 5.

FIG. 5 is a diagram illustrating another embodiment of a leakage current interruption circuit LC. FIG. 6 is a diagram illustrating an embodiment of the operation thereof. In the embodiment shown in FIG. 4, the leakage current is interrupted by keeping the source electrode S2 in a floating state. In contrast to this embodiment, in an embodiment shown in FIG. 5, the leakage current is interrupted by means of the fixed potential. To be more specific, as described in an embodiment in FIG. 6, keeping the gate electrode GSW at high potential during the operation causes a N-channel transistor MSW1 to stay in an ON state, and also causes a P-channel transistor MSW2 to stay in an OFF state, making it possible to keep the source electrode S2 at the ground potential. Moreover, keeping the gate electrode GSW at low potential during the standby time causes the MSW1 to stay in the OFF state, and also causes the MSW2 to stay in the ON state, making it possible to keep the potential of the source electrode S2 at the potential VBP that is equivalent to the precharge voltage of a read bit line. A main component of the leakage current flowing through the source electrode S2 is a subthreshold current flowing, from a read bit line RBL that is precharged to the high potential, through a cell in which the gate voltage of the storage transistor MR2 is kept in a high potential state. Accordingly, keeping the voltage of the source electrode S2 at the same level as the precharge voltage of the read bit line RBL makes it possible to interrupt the leakage current. In the above-mentioned embodiment shown in FIG. 5, the number of transistors constituting the leakage current interruption circuit LC increases. However, the source electrode S2 is controlled so that it is kept at the fixed potential. Therefore, as compared with the case where the source electrode S2 is kept in a floating state, this embodiment is effective in such a case where the potential of the source electrode S2 fluctuates as a result of coupling, or the like, causing the leakage current to increase.

Figure 7:
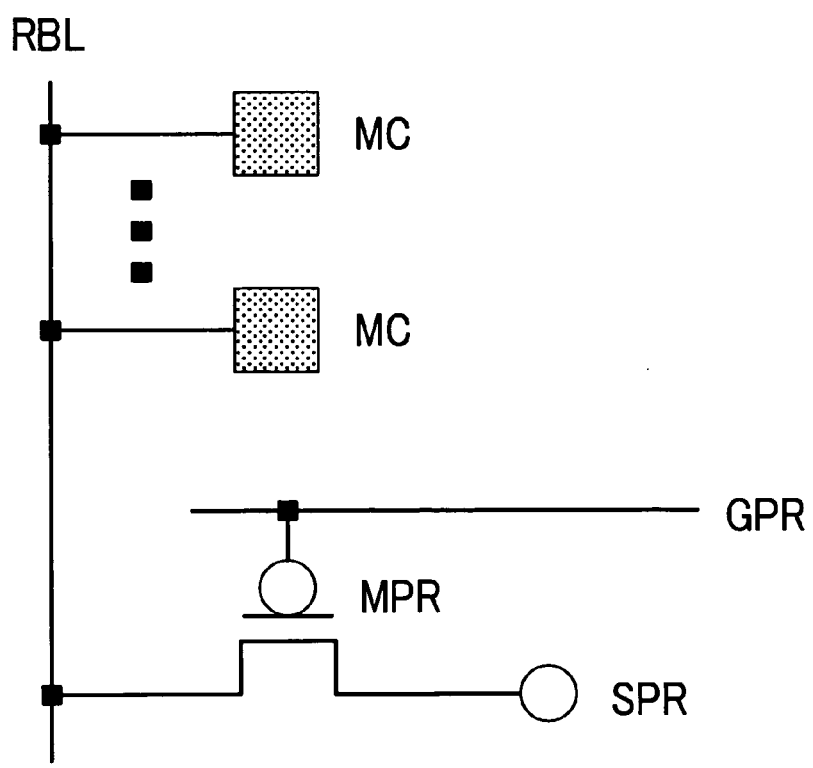
FIG. 7 is a diagram illustrating, as an embodiment, a precharge circuit of a read bit line.
Figure 8A:
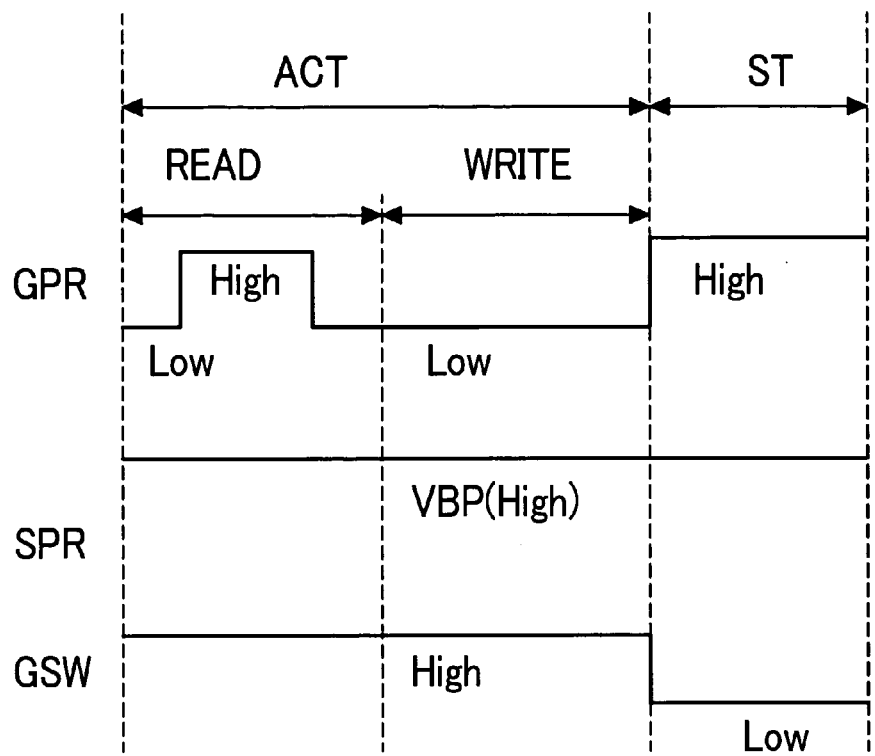
FIGS. 8A and 8B are diagrams each illustrating, as an embodiment, a timing chart of the embodiment in FIG. 7.
Figure 8B:
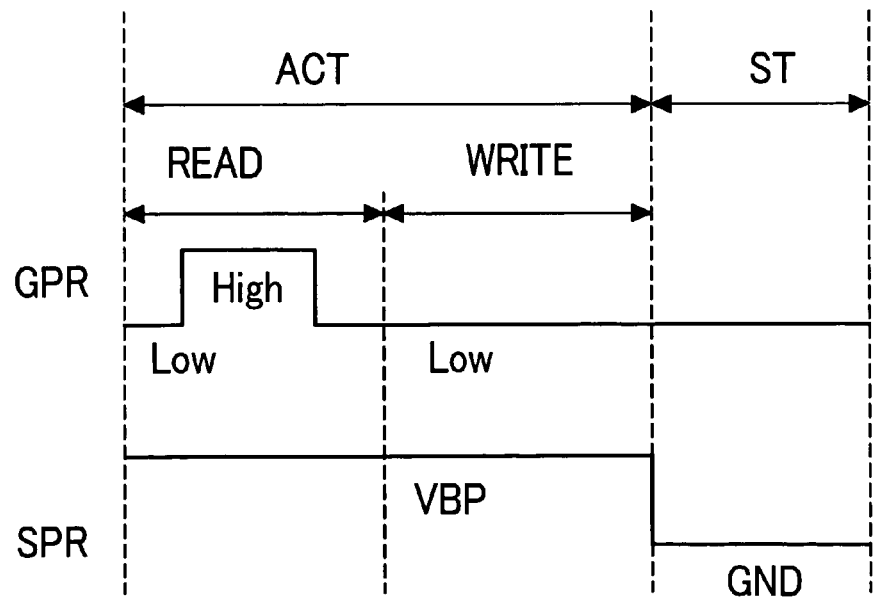

In the embodiment described above, the leakage current is interrupted by controlling the source electrode S2 of the storage transistor MR2. What will be described next with reference to FIGS. 7 and 8 is an embodiment in which the leakage is reduced by controlling a precharge circuit of a read bit line. FIG. 7 is a diagram illustrating an embodiment of a precharge circuit of a read bit line. A P-channel transistor MPR used for precharge is connected to a read bit line RBL to which a plurality of memory cells MC are connected. Keeping the gate electrode GPR at low potential causes the transistor MPR to stay in the ON state. As a result, the read bit line is precharged to the potential of an electrode SPR. FIGS. 8A and 8B are diagrams each illustrating, as an embodiment, a timing chart showing operation of a circuit in FIG. 7. FIG. 8A illustrates an embodiment in which an effect of interrupting the leakage current is increased in combination with the embodiments in FIGS. 3 and 4 that are embodiments of controlling the source electrode S2; and FIG. 8B illustrates an embodiment in which the leakage current is interrupted on the precharge circuit side without using a current switch on the source side.

To begin with, the embodiment in FIG. 8A will be described. During the active time ACT, excluding a period during which a signal from a memory cell is read out at the time of read operation READ, the gate electrode GPR of the transistor MPR is kept at low potential, which causes the transistor MPR to be turned ON. As a result, the read bit line RBL is precharged to the high potential that is the same as the source potential SPR of the MPR. On the other hand, during the standby time ST, the gate electrode GPR of the transistor MPR is kept at high potential, causing the MPR to be turned OFF. Moreover, because the embodiments in FIGS. 3 and 4 are used in combination, a transistor MSW which is provided in the source electrode S2 is also turned OFF during the waiting time. As a result, the leakage current is interrupted. According to this embodiment, because both of the transistor on the source electrode S2 side and the transistor on the precharge circuit side are turned OFF, it is possible to increase the interruption effect of interrupting the leakage current as compared with the case where only one transistor is turned OFF.

Next, operation of FIG. 8B will be described. Depending on a layout and a structure of a memory cell, or the number of available wiring lines, there is a case where it is difficult to install wiring of the source electrode S2. In addition, depending on a layout of a memory cell array, or the like, there is also a case where the area of a switch transistor provided in the source electrode S2, the area of the control circuit thereof, and the overhead of electric power become problems. In such cases, this embodiment is effective. As illustrated in FIG. 8B, during the active time ACT, excluding a period during which a signal from a memory cell is read out at the time of read operation READ, the gate electrode GPR of the transistor MPR is kept at low potential, which causes the transistor MPR to be turned ON. In addition, also during the standby time, the gate electrode GPR is kept at low potential in like manner, causing the transistor MPR to be turned ON. As a result, the read bit line RBL is precharged. During the active time ACT, the source of the SPR is kept at the high potential VBP. Accordingly, the read bit line RBL is precharged to the high potential VBP. On the other hand, during the standby time, the potential of the electrode SPR is controlled so that the potential of the SPR is kept at the ground potential GND. Accordingly, the read bit line is discharged to the potential that is close to an absolute value of a threshold voltage of the transistor MPR. After that, the potential gradually nears the ground potential because of the leakage current of MPR and the leakage current leaking to the grounded source electrode S2. As a result, the leakage current is interrupted. Thus, according to this embodiment, even if the source electrode S2 of the storage transistor MR2 is not provided with a switch transistor, the leakage current does not steadily flow from the read bit line RBL during the standby time. Incidentally, in FIG. 8B, the potential of the source electrode SPR in a precharge circuit is kept at the ground potential during the standby time. However, for reasons of the large wire capacitance of the electrode SPR, and the like, there is also a case where the overhead of a circuit for driving the potential of SPR becomes a problem as occasion requires. What is effective in such a case is a method in which the gate electrode GPR of the transistor MPR used for precharge is kept at high potential during the standby time while keeping the SPR at high potential both during the active time and during the standby time in like manner. If this method is used, the transistor MPR stays in the OFF state during the standby time, and consequently the electric current flowing from the electrode SPR is very little. During the standby time, the read word line RWL is kept at low potential, and accordingly the transistor MR1 of the memory cell also stays in the OFF state. Because of it, even if the SPR is kept at high potential, the leakage current leaking to the S2 is interrupted. Because this method does not require a drive circuit of the electrode SPR, the overhead of the area and the overhead of the electric power are little, which is advantageous. Incidentally, because operation of this method can be easily understood from the above description, the timing chart will not be described in detail. As described above, devising the bit line precharge circuit makes it possible to interrupt the leakage current. It is to be noted that also in the embodiments shown in FIGS. 8A and 8B, when performing the refresh operation during the standby time, the read operation needs to be performed. Therefore, as a matter of course, it is necessary to precharge the read bit line RBL to the required potential. Moreover, depending on how a sense amplifier, and the like, are configured, there is a possibility that a path of the leakage current will be newly made. However, in such a case, it is needless to say that the leakage current can be interrupted, in a manner similar to the above, by providing a switch for properly interrupting the leakage current to keep in the OFF state during the standby time, or by controlling the potential of an electrode, which causes the leakage, during the standby time.

Up to this point, the method for interrupting the leakage current of the 3T cell was described. According to these embodiment, the electric current consumption during the standby time can be reduced to a large extent, and it becomes possible to apply a memory with 3T cells to a field relating to the low electric power, which was not included in the applicable fields in the past.

Incidentally, as described above, because the 3T cell is a kind of a dynamic cell, the refresh operation is required. Accordingly, the standby power consumption includes not only the leakage current of the cell but also an electric current used for refresh. As far as the 3T cell is concerned, the gate capacitance of the storage transistor MR2 for storing information is small. Therefore, in general the 3T cell often has poor retention property. Thus, it is necessary to frequently refresh the cell, and there is a case where the electric power used for refresh cannot be ignored. In this case, with the object of decreasing the leakage current from the storage capacitance, it is desirable to use as an insulated layer of the storage transistor MR2 a material in which the gate current can be ignored, or to make the thickness of an isolation film sufficiently thick. For example, making use of an oxide layer having a thickness of about 4.5 nm or more is effective. In this case, if the transistors MR1, MR2 are provided with a common isolation film having the same thickness, it is possible to reduce the overhead of the area and that of a manufacture process. Moreover, with the object of decreasing the leakage current from the write transistor, what is effective is using a very thin poly-silicon TFT transistor in which the film thickness of a channel is 5 nm or less as shown in FIGS. 9A and 9B.

Figure 9A:
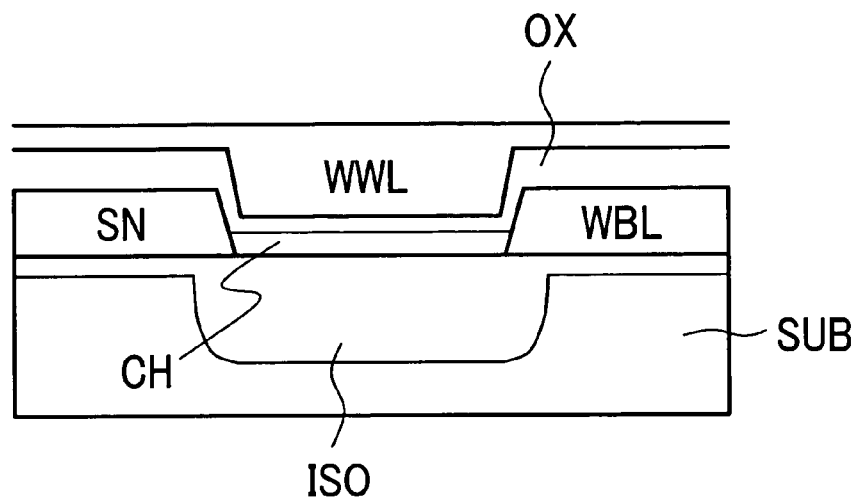
FIGS. 9A and 9B are diagrams each illustrating, as an embodiment, a cross section of a write transistor used to improve the retention property of a 3T cell.

In an embodiment shown in FIG. 9A, a transistor MW is two-dimensionally formed on an isolation region ISO formed in a semiconductor substrate SUB. In this embodiment, CH is a channel part and is formed of a poly-silicon thin film having a thickness of about 5 nm or less. As described below, reducing the leakage current to a large extent by use of this makes it possible to improve the retention property. OX is an insulated layer; WWL is a gate electrode of the transistor MW, which is used as a write word line; WBL is a source electrode, which is used as a write bit line; and SN is a storage electrode, which corresponds to a drain of the transistor MW. In this embodiment, as is the case with ordinary transistors, the transistor MW is two-dimensionally formed on a substrate. Because of it, there is no large difference in level between a part on which the transistor MW is formed and a part on which the transistor MW is not formed. Therefore, processes including wiring and contact, used for making the connection between the transistor MW and an ordinary transistor, become easy, which is a merit.

Figure 9B:
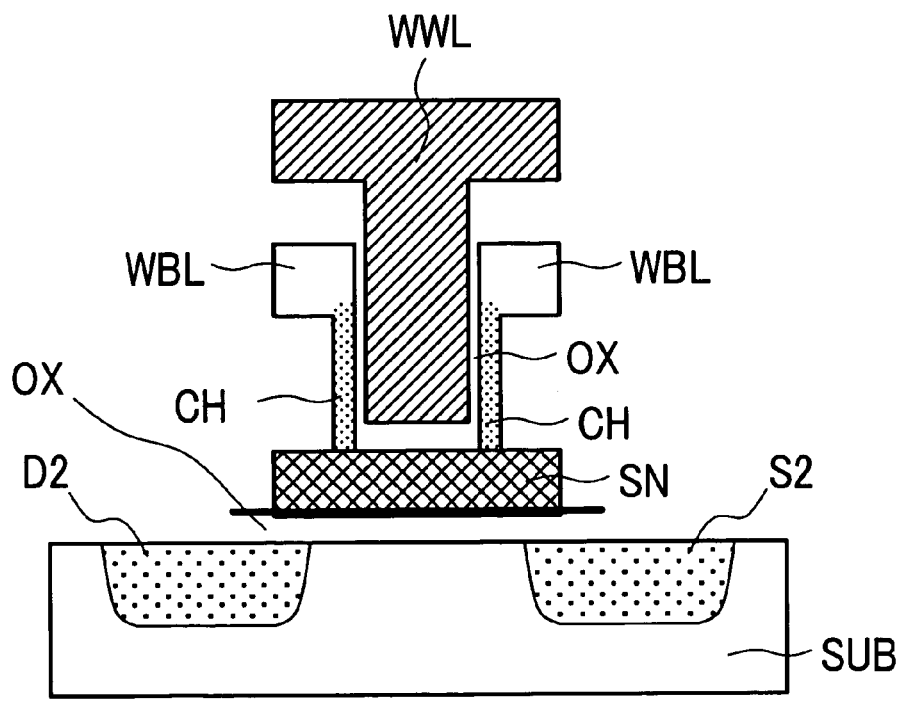

What is illustrated in FIG. 9B is an embodiment that is suitable for achieving not only the improvement in retention property but also higher integration of 3T cells. This embodiment is in particular effective if the increase in the area becomes a problem in the above flat structure. In this embodiment, the transistor MW having a vertical structure is formed inside a hole that is made on a gate electrode of the storage transistor MR2 of the 3T cell. CH is a channel part of the transistor MW, and is formed of a thin film such as polycrystalline silicon having a thickness of about 5 nm or less. A gate electrode of the transistor MW has a cylindrical shape, and is surrounded by an oxide layer OX and the channel part CH. WBL is a part corresponding to a write bit line. One (SN) of source/drain areas of the write transistor MW corresponds to a gate electrode of the transistor MW2, and controls through the gate oxide (OX) an electric current flowing between semiconductor areas (S2, D2) formed in the semiconductor substrate (SUB).

In both of the cases shown in FIGS. 9A and 9B, if the potential of WWL corresponding to a gate electrode becomes high, the channel part CH is brought into a conducting state; and if the potential of WWL becomes low, the channel part CH is brought into a nonconducting state. Because the thickness of the channel CH is about 5 nm or less, which is very thin, the leakage current during OFF can be extremely reduced as compared with a case where an ordinary transistor is used. In the case of the ordinary transistor, the leakage current during OFF is about $10^{-10}$ A to $10^{-12}$ A. On the other hand, in the case of the thin film transistor in which a channel has a thickness of about 5 nm or less as described in this embodiment, it is also possible to reduce the leakage current to $10^{-19}$ A as a result of a quantum mechanical confinement effect in a film thickness direction. Invention relating to a field-effect transistor which includes a thin film channel having such a structure is described, for example, in the patent document 2, the title of which is semiconductor device and semiconductor integrated circuit. According to this embodiment, because the leakage current of the transistor MW is very little, it is possible to hold information stored in a storage node SN for a long time. The electric charge which can be accumulated in a gate electrode corresponding to SN is the order of about $10^{-15}$ C (coulomb). Accordingly, on the assumption that the leakage current of MW is $10^{-19}$ A, the length of time before 10% of electric charge leaks is about 1000 seconds. Taking the variation in leakage current of the transistor MW and its operation at high temperature into consideration, it is also thought that a guaranteed value needs to be set at smaller value from the viewpoint of design. Nevertheless, in any case, an effect which can be expected is large enough to reduce the standby current. Therefore, by using the above-mentioned 3T cell in combination with the embodiment for reducing the leakage current, it is possible to realize a semiconductor integrated circuit that includes a memory, the standby current of which is very little.

What will be described below includes embodiments to which the above embodiments are modified, detailed operation of the embodiments, and an embodiment that is effective for a memory using a memory cell, as shown in FIG. 2, and in which a higher effect of the embodiment is produced by combining this embodiment with the embodiments described above.

Figure 10:
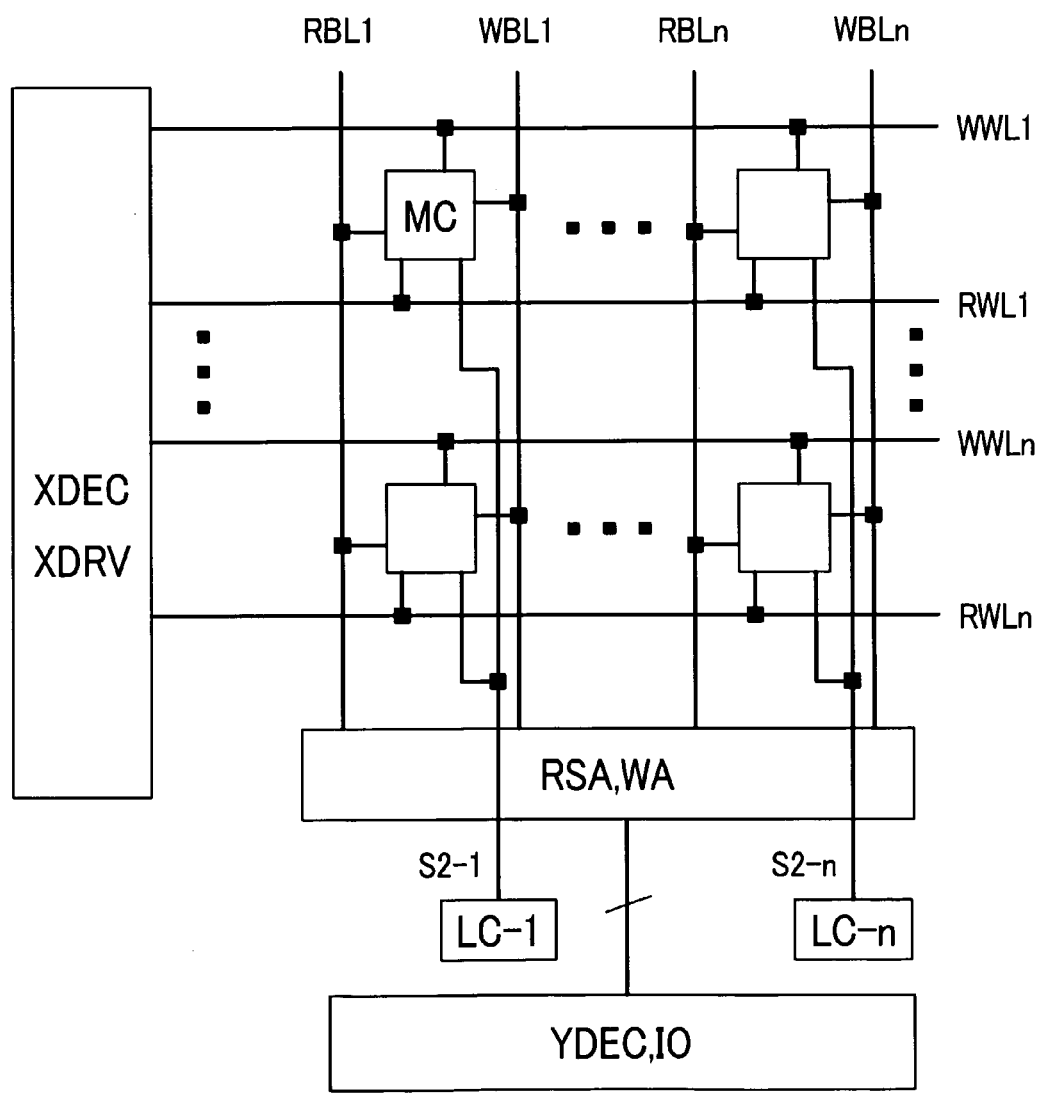
FIG. 10 is a diagram illustrating an embodiment in which wiring of a source electrode S2 is installed in a direction parallel to bit lines.

FIG. 10 is a diagram illustrating an embodiment in which wiring lines of a source electrode S2 of a storage transistor are placed in parallel with bit lines. In the embodiment shown in FIG. 1, S2 is extended to the outside of an array by use of a wiring line parallel with a read word line, and is then connected to the leakage interruption circuit. However, in this embodiment, S2 are wiring lines parallel with read bit lines, and are connected to leakage interruption circuits LC-1 through LC-n that are provided on a read bit line basis. In general, when accessing a memory array, only one read word line is selected. Therefore, in a configuration as shown in this embodiment, the leakage interruption circuit LCi (i is from 1 to n) has only to supply a read electric current of one memory cell. Accordingly, it is possible to reduce the size of a switching circuit forming the LCi. Thus, the area of the whole memory circuit including peripheral circuits for controlling LCi can be reduced as occasion requires. Also in the embodiment shown in FIG. 1, it is possible to distribute the leakage interruption circuits on a word line basis. However, this embodiment produces another effect, which will be described as below. As far as the 3-transistor cell shown in FIG. 2 is concerned, even if a read word line is selected to turn the transistor MR1 ON, information stored in a gate electrode of the MR2 is not destructed. In other words, nondestructive read is possible. In this embodiment, therefore, among memory cells on a selected read word line, it becomes possible to activate only a leakage interruption circuit that is connected to a memory cell from which information needs to be read out. Such control can be easily achieved by making use of a signal of a Y decoder. As a result, according to this embodiment, the leakage current at the time of reading can also be reduced to a required minimum.

Figure 11:
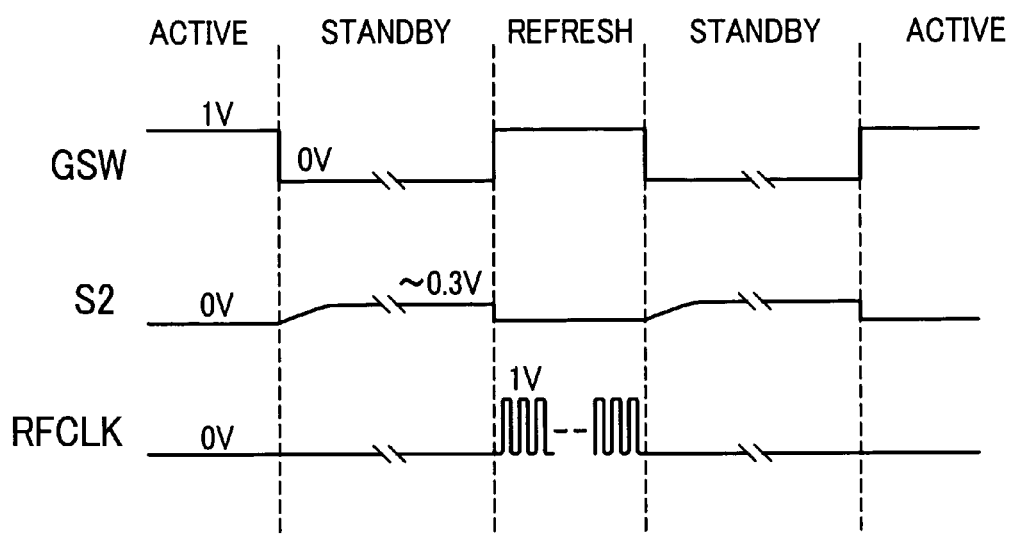
FIG. 11 is a diagram illustrating, as an embodiment, a timing chart that shows operation of the embodiment in FIG. 3 in detail.
Figure 12:
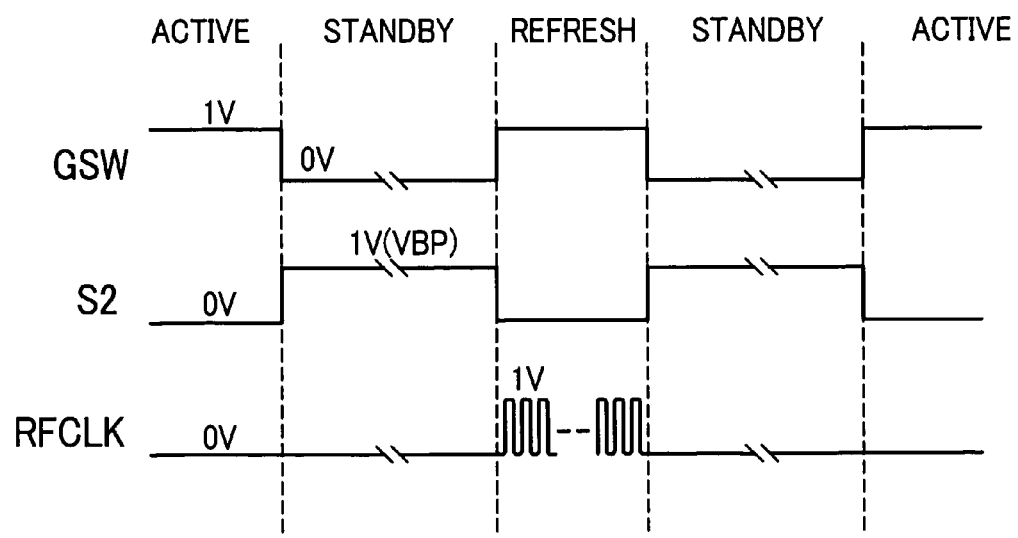
FIG. 12 is a diagram illustrating, as an embodiment, a timing chart that shows operation of the embodiment in FIG. 5 in detail.
Figure 13A:
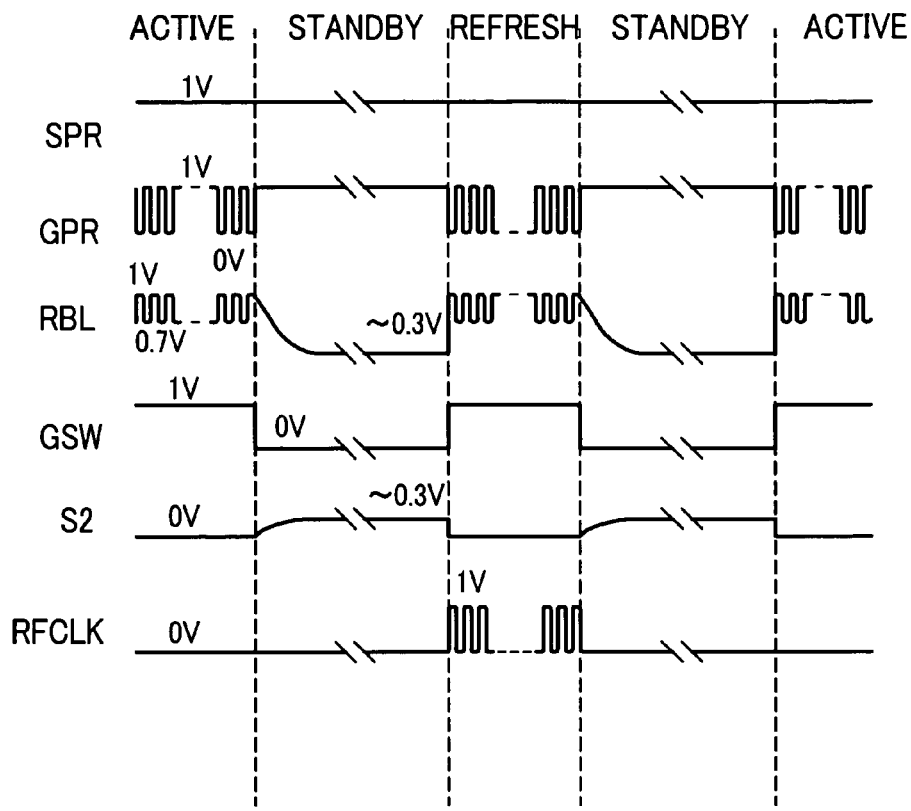
Figure 13B:
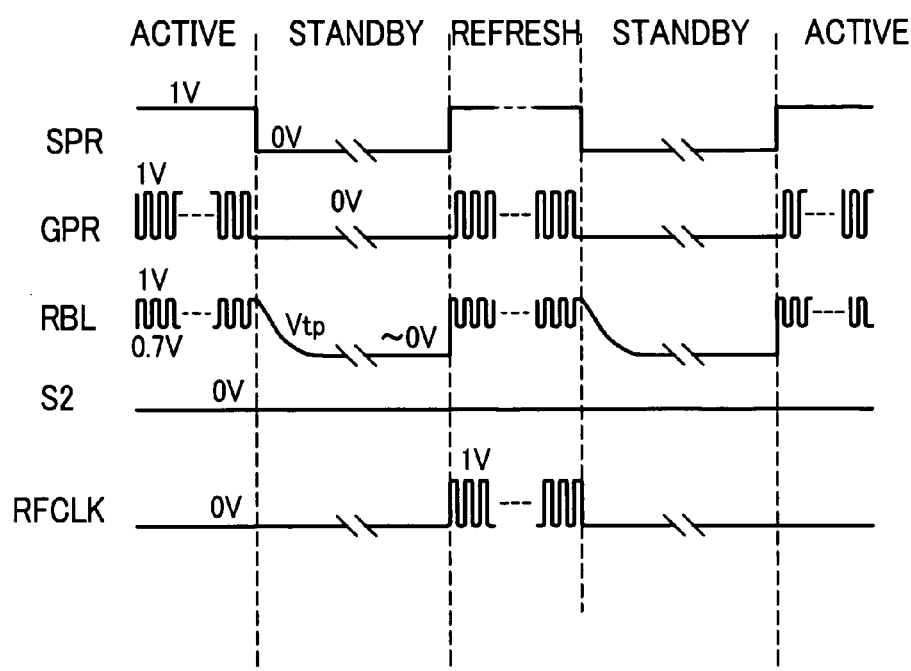

Next, operation of embodiments relating to the leakage interruption shown in FIGS. 3, 5 and 7 will be described with reference to FIGS. 11, 12 and 13. Although the operation was described in theory with reference to FIGS. 4, 6 and 8, the operation will be described here corresponding to operation states of a memory. In FIGS. 11, 12 and 13, operation modes of a memory are shown as Active (active state), Standby (standby state), and Refresh (refresh state). In FIGS. 4, 6 and 8, which illustrate basic operation in FIGS. 3, 5 and 7, write operation was also illustrated. Here, only read operation is illustrated for the sake of simplification. It is to be noted that FIGS. 13A and 13B are embodiments that correspond to FIGS. 8A and 8B respectively. Although refresh is performed in the standby state here, it is a matter of course that refresh may also be performed in the active state if necessary. In FIGS. 11, 12 and 13, RFCLK indicates a refresh control clock used to perform read and write, which are required for refresh operation. When refreshing the memory cell shown in FIG. 3, information which has been read out needs to be written again. However, FIGS. 13A and 13B illustrate only a waveform of a read bit line for the sake of simplification. Incidentally, because the bit line used for read is separated from the bit line used for write in the memory cell in FIG. 3, refresh operation can be performed at high speed. In addition, although a potential level of a signal is assumed to be 0 V to 1 V here, it is needless to say that the present invention is not limited to this range. Moreover, although the potential observed when S2 stays in the floating state is assumed to be 0.3 V, this is also an example. As a matter of course, the potential does not always become 0.3 V depending on a circuit configuration and a transistor parameter.

To begin with, the operation in FIG. 3 will be described with reference to FIG. 11. When the memory is in the active state, and during refresh, the potential of the gate electrode GSW becomes 1 V, causing the transistor MSW in FIG. 3 to be turned ON. As a result, the source electrode S2 of the storage transistor becomes 0 V. This makes it possible to perform read operation of a memory cell. Incidentally, in the refresh state, as a result of inputting the refresh control clock RFCLK, information is read out from the memory cell, and then the information is written again in an inverted manner. This is how the refresh of a 3-transistor cell is performed. On the other hand, in the standby state, GSW becomes 0 V, which causes the transistor MSW in FIG. 3 to be turned OFF. As a result, the source electrode S2 of the storage transistor enters the floating state, which interrupts the leakage current flowing through the storage transistor. This makes it possible to reduce the electric current consumption during the standby state.

Subsequently, with reference to FIG. 12, the operation in FIG. 5 will be described corresponding to the states of a memory. In the active state, and in the refresh state, the gate electrode GSW is kept at 1 V, which causes the transistor MSW1 to stay in the ON state and also causes the MSW2 to stay in the OFF state. As a result, as is the case with the embodiment in FIG. 11, the source electrode S2 is kept at the ground potential. On the other hand, keeping the gate electrode GSW at low potential during the standby time causes the MSW1 to stay in the OFF state, and also causes the MSW2 to stay in the ON state, making it possible to keep the potential of the source electrode S2 at the potential VBP that is equivalent to the precharge voltage of a read bit line. As described with reference to FIG. 5, a main component of the leakage current flowing through the source electrode S2 is a subthreshold current flowing, from a read bit line RBL that is precharged to the high potential, through a cell in which the gate voltage of the storage transistor MR2 is kept in a high potential state. Accordingly, keeping the voltage of the source electrode S2 at the same level as the precharge voltage of the read bit line RBL makes it possible to interrupt the leakage current.

In the embodiment shown in FIG. 11, as compared with FIG. 12, fluctuations in potential of S2 are small when shifting from the standby state to the active state, which may be advantageous in terms of speed. If the source electrode S2 is brought into the floating state, noises generated when a logical circuit on the same chip operates cause the potential of S2 to fluctuate, and consequently an unexpected leakage current may flow. If there is such concern about the unexpected leakage current, it is desirable to adopt the embodiments in FIGS. 5 and 12 in which S2 is kept at the fixed potential.

Lastly, with reference to FIGS. 13A and 13B, the operation in FIG. 7 will be described corresponding to the states of a memory. As operation methods of the embodiment in FIG. 7, two embodiments were illustrated in FIGS. 8A and 8B in advance. Here, an embodiment corresponding to FIG. 8A is illustrated in FIG. 13A; and an embodiment corresponding to FIG. 8B is illustrated in FIG. 13B. In the embodiment shown in FIG. 13A, the potential of the source electrode SPR of the transistor MPR in FIG. 7 is set at high potential (here, 1 V). As a matter of course, at the time of read operation during the "Active" time, or at the time of read operation during the "Refresh" time, the potential of the gate electrode GPR of MPR is set at 1 V when reading out information from a memory cell on a read bit line. Besides this case, the potential of the gate electrode GPR is kept at 1 V also during the "Standby" time. As a result, during the standby time, the transistor MPR used for precharge stays in the OFF state. In addition, in the standby state, the gate electrode GSW of the transistor MSW in the FIG. 3, which is provided in the source electrode S2, becomes 0 V, causing MSW to be turned OFF. This makes it possible to effectively interrupt the leakage current as described with reference to FIG. 8A. During the standby time, both the read bit line and the source electrode S2 enter the floating state. Accordingly, as shown in FIG. 13A, the potential of the read bit line is gradually nearing that of the source electrode S2 (in the figure, 0.3 V is quoted as an example). Thus, according to this embodiment, the transistor on the source electrode S2 side and the transistor on the precharge circuit side are used in combination to interrupt the leakage current, which makes it possible to effectively reduce the standby current.

It is to be noted that at each read operation, the potential of the read bit line fluctuates from the precharge potential in response to information stored in a memory cell. More specifically, if the potential of a storage node of the memory cell is high, the potential of the read bit line decreases, whereas if the potential of the storage node is low, the potential of the read bit line does not decrease. Each of FIGS. 13A and 13B illustrates an example in which the potential of the read bit line decreases at each read operation. Moreover, although the potential observed when the read bit line RBL decreases is assumed to be 0.7 V, this is merely an example. The present invention is not limited to this. It is a matter of course that a value of the potential may vary depending on how the sense amplifier is designed.

In the embodiment shown in FIG. 13B, if a memory is in the active state or in the refresh state, the potential of the source electrode SPR of the transistor MPR in FIG. 7 is set at 1 V. If the memory is in the standby state, the potential of the source electrode SPR is set at 0 V. Consequently, in the active state and in the refresh state, the precharge potential of the read bit line RBL becomes 1 V, which is the high potential. In this case, the precharge potential is set as a result that the gate electrode GPR of the transistor MPR becomes 0 V. In the standby state, when the gate electrode GPR becomes 0 V, the source potential SPR becomes 0 V. As a result, the potential of the read bit line decreases to a level of an absolute value Vtp of a threshold voltage of the P-channel transistor MPR, and then slowly decreases toward 0 V. Thus, when the potential of the read bit line RBL becomes about 0 V, a leakage current flowing from the read bit line RBL to the source electrode of the storage transistor in the memory cell is interrupted. Thus, according to this embodiment, devising the precharge circuit makes it possible to interrupt the leakage. This embodiment is suitable for a case where it is difficult to install wiring of the source potential of a storage transistor of a memory cell for some reason or other. Incidentally, besides the above-mentioned methods, as described with respect to the illustration in FIGS. 8A and 8B, there is also another effective method, in which although SPR is kept at high potential, the transistor MPR used for precharge is kept OFF during the standby time so that precharge is not performed. Further, there are of course various modified methods. For example, a source electrode of MPR is provided with a switch, and the leakage is interrupted by the switch. However, because they are easy to configure if the above embodiments are referred to, their description will be omitted here.

Up to this point, the embodiment was described mainly about the method for interrupting the leakage current in the standby state. What will be described next is an embodiment relating to a method for generating a reference voltage required for read operation. The present invention is mainly based on 3-transistor cells. However, because the number of read bit lines of this type of cell is one, if read operation is performed with a general differential sense amplifier, a circuit for generating a reference voltage is required. In order to prevent the sense amplifier from malfunctioning at the time of reading, the reference voltage must stay between a signal voltage of a read bit line observed when contents of a selected cell is 0 and a signal voltage of the read bit line observed when contents of the selected cell is 1. Because differential sense amplifiers are usually capable of detecting a signal ranging from several tens to several hundreds of mV, the circuit for generating the reference voltage needs to be devised so as to reduce a variation in generated voltage. An embodiment which is suitable for generating a reference voltage with a high degree of accuracy will be described with reference to FIGS. 14A and 14B through 17 as below.

Figure 14A:
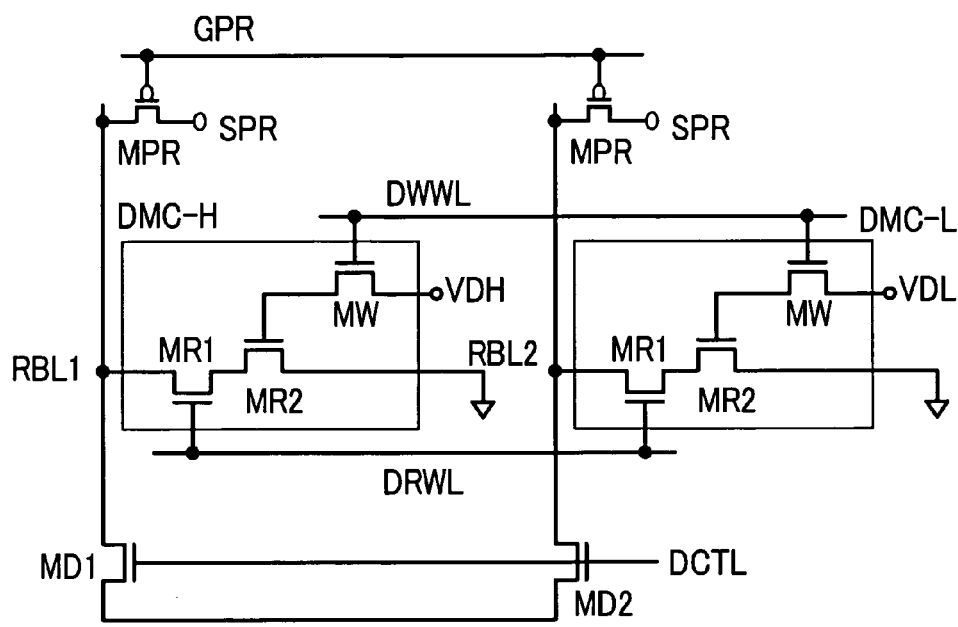
FIGS. 14A and 14B are diagrams illustrating, as an embodiment, principles of a method whereby a reference voltage used at the time of reading is generated with a high degree of accuracy using a plurality of dummy cells.
Figure 14B:
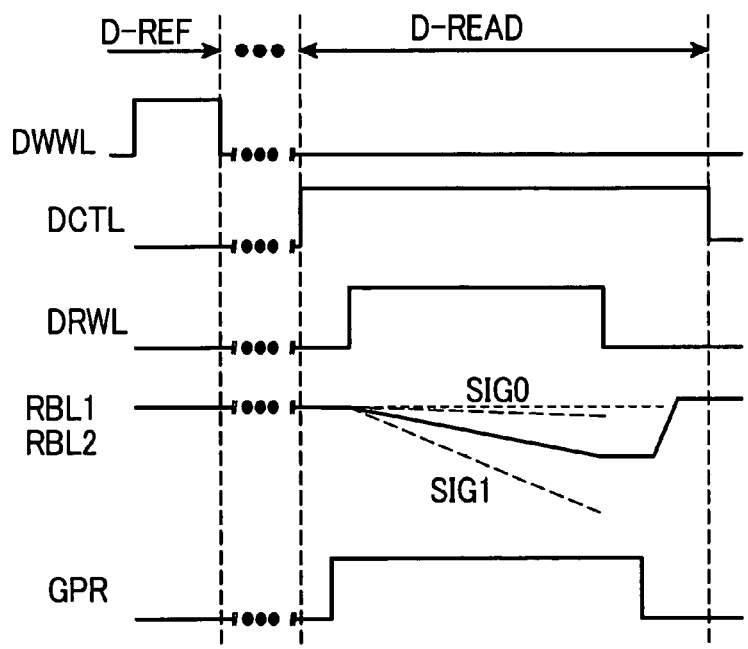

FIGS. 14A and 14B are diagrams illustrating, as an embodiment, principles of a circuit for generating a reference voltage. Principles of operation will be described with reference to these figures. A method applied to a memory array will be specifically described with reference to FIGS. 15 and 16. Incidentally, it is needless to say that a method for generating a reference voltage described here can be properly combined with the embodiment relating to the interruption of the leakage current described above, or with the embodiment which uses a thin-channel transistor as a write transistor. However, even if this method is independently used in combination with 3-transistor memory cells, this is an effective method for generating a highly precise reference voltage.

In FIG. 14A, DMC-H and DMC-L are 1 signal generation dummy cell and 0 signal generation dummy cell respectively. The layout of these dummy cells, and dimensional constants of transistors MR1, MR2 and MW constituting the dummy cell, are configured to be the same as much as possible based on memory cells. In addition, it is so devised that the number of read bit lines RBL1 and RBL2 is made equivalent to the number of memory cells MC that are connected to read bit lines connected to the sense amplifier (not illustrated) so that the capacity of bit lines connected to the sense amplifier becomes equal. DWWL is a dummy write word line. RBL1 and RBL2 are read bit lines. A plurality of memory cells, a differential sense amplifier, and the like, are connected to each of the read bit lines RBL1, RBL2. However, they are omitted in FIG. 14A.

Operation will be described with reference to FIG. 14B. In the first place, by driving the dummy write word line DWWL, refresh D-REF of a dummy cell is performed. As understood from FIG. 14A, driving the dummy write word line DWWL causes the write transistor MW in the dummy cell to enter the ON state. As a result, a high voltage VDH is applied to the 1 signal generation dummy cell MC-H, and a low voltage VDL is applied to the 0 signal generation dummy cell DMC-L. Because the dummy cell has the same constant as that of the memory cell, the dummy cell is refreshed in the same cycle as that of the memory cell. Next, read operation D-READ which reads a dummy cell to generate a reference signal will be described. As illustrated in FIG. 14B, a dummy control signal DCTL is driven to the high potential. As a result, the transistors MD1 and MD2 enter the ON state, and the read bit lines RBL1 and RBL2 are short-circuited. Then, an electric current from the source electrode SPR of the transistor MPR, which is kept at high potential, causes them to become the same potential. Here, if the potential of SPR is high, more specifically, the precharge potential is high, there is also a possibility that the transistors MD1 and MD2 will not enter the ON state sufficiently. In this case, the potential of DCTL has only to be increased to a voltage higher than SPR, or a P-channel transistor has only to be adopted. If a P-channel transistor is adopted, it is a matter of course that the relationship of the potential of the signal DCTL is reversed. Subsequently, the gate electrode GPR of the transistor MPR used to precharge the read bit line is driven to the high potential, causing the transistor MPR to enter the OFF state. Consequently, a dummy read word line DRWL is driven to the high potential. As a result, the read bit lines RBL1 and RBL2 which are short-circuited are driven by the read current from two dummy cells DMC-H and DMC-L at the same time. As described above, these dummy cells have the same dimensional constant and layout shape as those of the memory cell MC. Accordingly, a read current of the 1 signal generation dummy cell DMC-H becomes substantially equivalent to an electric current from a memory cell MC in which 1 is stored; and a read current of the 0 signal generation dummy cell DMC-L becomes substantially equivalent to an electric current from a memory cell MC in which 0 is stored. Moreover, as described above, because it is so devised that the capacity of the read bit lines RBL1 and RBL2 become the same as that of the read bit line connected to one input of the sense amplifier (not illustrated), the potential occurring in the read bit lines RBL1 and RBL2, that is to say, the reference potential, corresponds to a midpoint between the read bit line potential SIG1 observed when 1 is read out and the read bit line potential SIG0 observed when 0 is read out. In this embodiment, because the dummy cell has the same dimensional constant and layout shape as those of the memory cell MC, even if properties of the memory cell MC on a chip used in this embodiment vary due to the variation in manufacture process of transistors, and the like, read signals of the dummy cell also vary in like manner. Therefore, very stable read operation can be expected.

Figure 15:
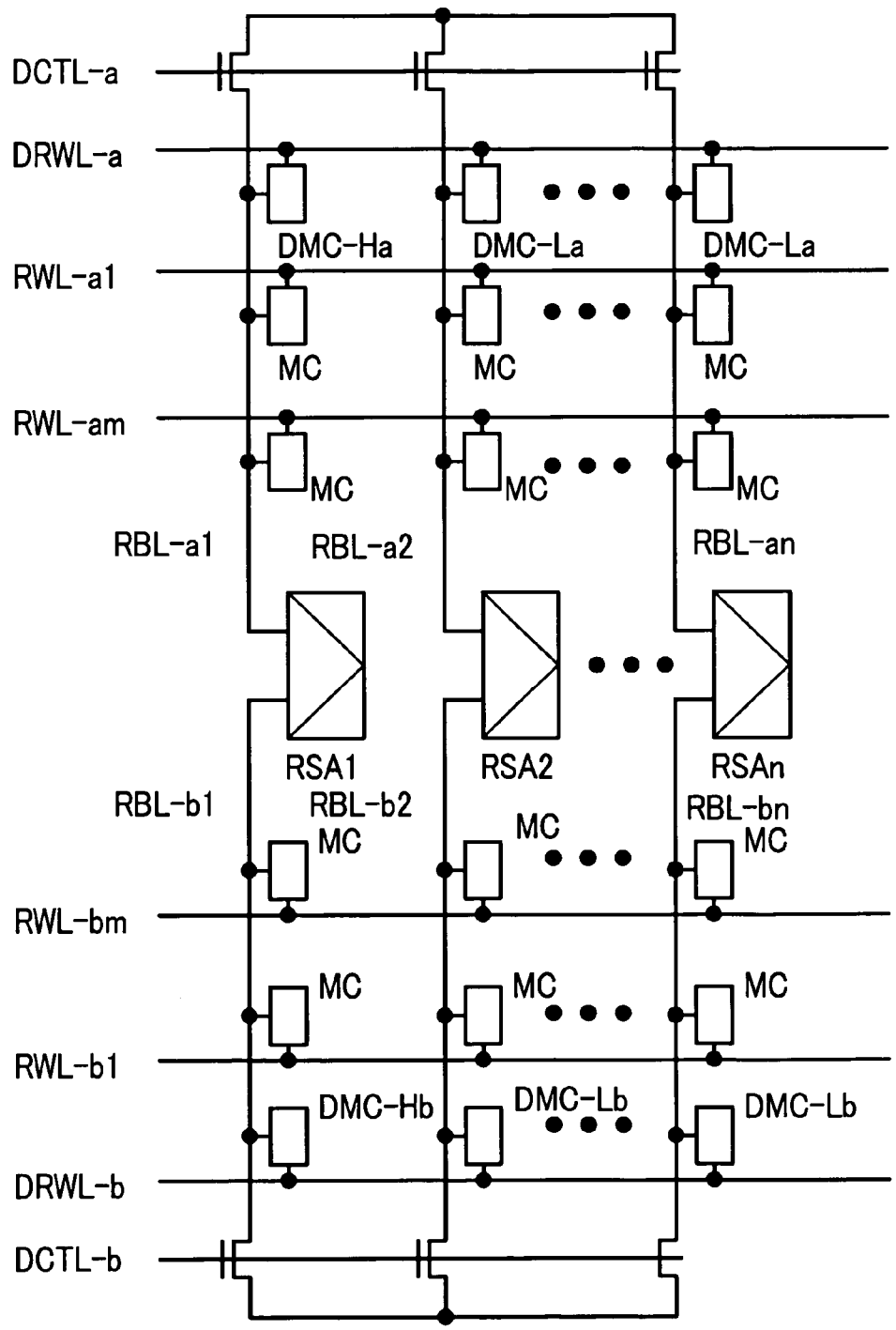
FIG. 15 is a diagram illustrating an embodiment in which the principles in FIGS. 14A and 14B are applied to a layout of an open bit line.
Figure 16:
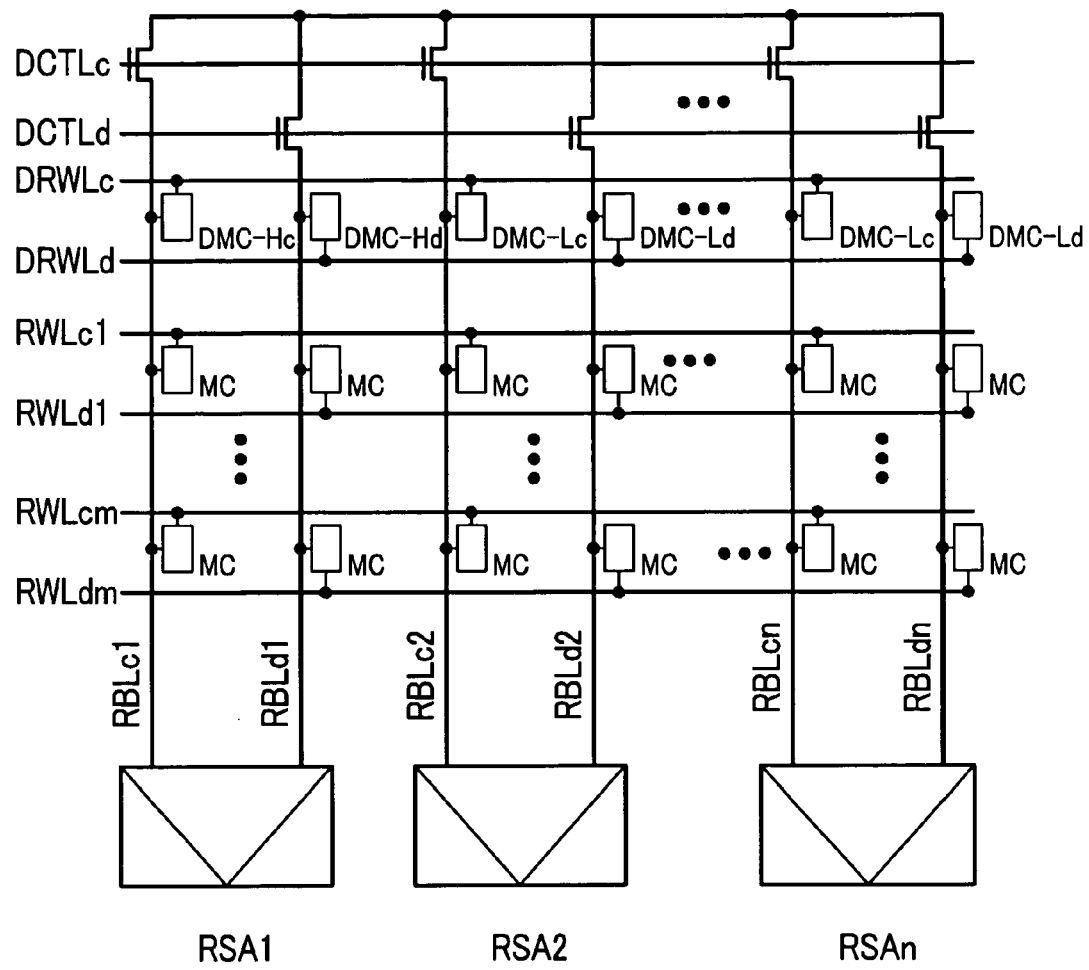
FIG. 16 is a diagram illustrating an embodiment in which the principles in FIGS. 14A and 14B are applied to a layout of a folded bit line.

FIG. 15 is a diagram illustrating an embodiment in which a memory cell array is configured on the basis of the principles of the above embodiment. MC is a 3-transistor memory cell described in the above embodiments. Incidentally, in order to avoid the figure from becoming complicated, write word lines, write bit lines, wiring of a source electrode S2 of a write transistor, a leakage current interruption circuit LC, a decoder, an input/output circuit, a circuit used to precharge a read bit line, and the like, are omitted. However, it is possible to configure them easily if the embodiments described above are referred to. Incidentally, it is needless to say that as is the case with the memory cell, the means for interrupting the leakage current can also be applied to the dummy cell. In FIG. 15, memory arrays are formed in the upper and lower parts of the diagram across sense amplifiers RSA1, RSA2, . . . RSAn used for read operation. With the object of discriminating the upper and lower arrays, subscripts a and b are appended to the memory arrays except memory cells MC. It is to be noted that DMC-La, DMC-Lb are the 0 signal generation dummy cells described in the embodiment in FIGS. 14A and 14B, and that DMC-Ha and DMC-Hb are the 1 signal generation dummy cells described in the embodiment in FIGS. 14A and 14B. As shown in the figure, these dummy cells are placed so that the 0 signal generation dummy cells and the 1 signal generation dummy cells are alternately aligned on bit lines that are adjacent to each other. To be more specific, in each individual memory array, there are the 0 signal generation dummy cells, the number of which is n/2 (n is the number of read bit lines), and there are also the 1 signal generation dummy cells, the number of which is n/2.

Read operation in this embodiment will be described as below.

In this embodiment, for a sense amplifier, when selecting a memory cell on the upper side of the diagram, dummy cells DMC-Lb and DMC-Hb on the lower side of the diagram are operated to generate a reference voltage, whereas when selecting a memory cell on the lower side of the diagram, dummy cells DMC-La and DMC-Ha on the upper side of the diagram are operated to generate a reference voltage. What will be described as an example is a case where a memory cell MC connected to a read word line RWL-a1 is selected. Basic operation is performed as shown in FIG. 14B. To begin with, when the transistor MPR (not illustrated in FIG. 15) for precharging a read bit line stays in the ON state, a dummy control signal DCTL-b is driven to short-circuit the read bit lines RBL-b1, . . . , RBL-bn. Next, after bringing into the OFF state the transistor MPR (not illustrated) used for precharge, the read word line RWL-a1 and the dummy read word line DRWL-b are selected to drive the selected lines to the high potential. As a result, on the read bit lines RBL-a1, . . . , RBL-an of the memory cell array on the upper side of the diagram, the potential changes in response to information stored in the memory cell that is connected to each read bit line. If the information of the memory cell is 1, the potential changes as indicated by SIG1 in FIG. 14B. If the information of the memory cell is 0, the potential changes as indicated by SIG0. On the other hand, in the memory cell array on the lower side, the short-circuited read bit lines are driven to the reference potential by the 1 signal generation dummy cells DMC-Hb, the number of which is n/2, and by the 0 signal generation dummy cells DMC-Lb, the number of which is n/2. Because the number of the 1 signal generation dummy cells DMC-Hb is equivalent to that of the 0 signal generation dummy cells DMC-Lb, the reference voltage becomes the middle potential between a read signal from a memory cell MC in which 1 is stored (the change in potential of the read bit line) and a read signal from a memory cell MC in which 0 was stored. As a result, the read signal from the memory cell of the upper memory cell array, and the reference voltage from the lower memory cell array, are inputted into each sense amplifier for read operation, where they are amplified, and consequently the potential difference thereof is amplified. Then, the amplified potential difference is read out to the outside through an input/output circuit (not illustrated). At the last read operation cycle, the potential of the read word line RWL-a1 and that of the dummy read word line DRWL-b are brought into the low potential state to precharge the read bit line, and then the potential of the dummy control signal DCTL-b is brought into the low potential state. In this embodiment, the number of dummy cells used to generate the reference voltage is 2/n every time. Here, n is the number of read bit lines. In usual design, n approximately ranges from several tens to several thousands. Therefore, the influence of variations in individual dummy cells can be reduced, and accordingly more stable read operation can be expected. If variation in electric current of dummy cells is based on the Gaussian distribution, it can be expected that the variation decreases in inverse proportion to the square root ($\sqrt{(n/2)}$) of the number of dummy cells. Incidentally, in the embodiment described above, the number of the 0 signal generation dummy cells is made equivalent to that of the 1 signal generation dummy cells. However, depending on the retention property of the memory cell, or the like, there may be a case where it is desirable to allow an extra margin for reading either 0 signal SIG0 or 1 signal SIG1. In such a case, it is possible to adjust a value of the reference potential if necessary by changing the number of the 1 signal generation dummy cells and that of the 0 signal generation dummy cells. Also in this case, n is large. Accordingly, there is an advantage that fine adjustment becomes possible. The embodiment in FIG. 15 is a configuration example of a so-called open bit line type. Here, because the read word line and the dummy read word line are simultaneously driven at the time of read operation, noises occurring on two read bit lines inputted into the sense amplifier are in phase with each other. In addition, the amount of the noises are substantially the same. Accordingly, the bad influence of the noises at the time of reading can be avoided, which is also a produced advantage. However, as occasion requires, there may also be a case where it is desirable to further reduce the influence of noises, or a case where, for the sake of a layout, it is desirable to adopt a so-called folded bit line configuration. In this case, the configuration as shown in the embodiment in FIG. 16 suffices. In this figure, a subscript c is appended to a read bit line inputted into the left side of a sense amplifier, a dummy cell connected to it, and the like; and a subscript d is appended to a read bit line inputted into the right side of the sense amplifier, a dummy cell connected to it, and the like. As easily inferred from the description in FIG. 15, when selecting a memory cell connected to a read bit line inputted into the left side of the sense amplifier, what is driven are: a dummy word line of a dummy cell connected to a read bit line inputted into the right side of the sense amplifier; and the dummy control signal DCTLd. On the other hand, when selecting a memory cell connected to a read bit line inputted into the right side of the sense amplifier, what are driven are: a dummy word line of a dummy cell connected to a read bit line inputted into the left side of the sense amplifier; and the dummy control signal DCTLc. An advantage of this embodiment is that a read word line and a dummy read word line intersect all read bit lines. Therefore, the amount of noises occurring on read bit lines as a result of the change in potential of the read word line and that of the dummy read word line become the same. As described above, even in the above embodiment of the open bit line, it is possible to make the noises occurring on the read bit lines inputted into the sense amplifier substantially equivalent. However, for example, if the resistance of wiring which forms the read bit line is large, there is also a case where there arises a slight difference in the amount of noise due to the difference in distance between the distance from the sense amplifier to a selected read word line and the distance from the sense amplifier to a dummy read word line. If such a matter becomes a problem, this embodiment is effective.

Figure 17:
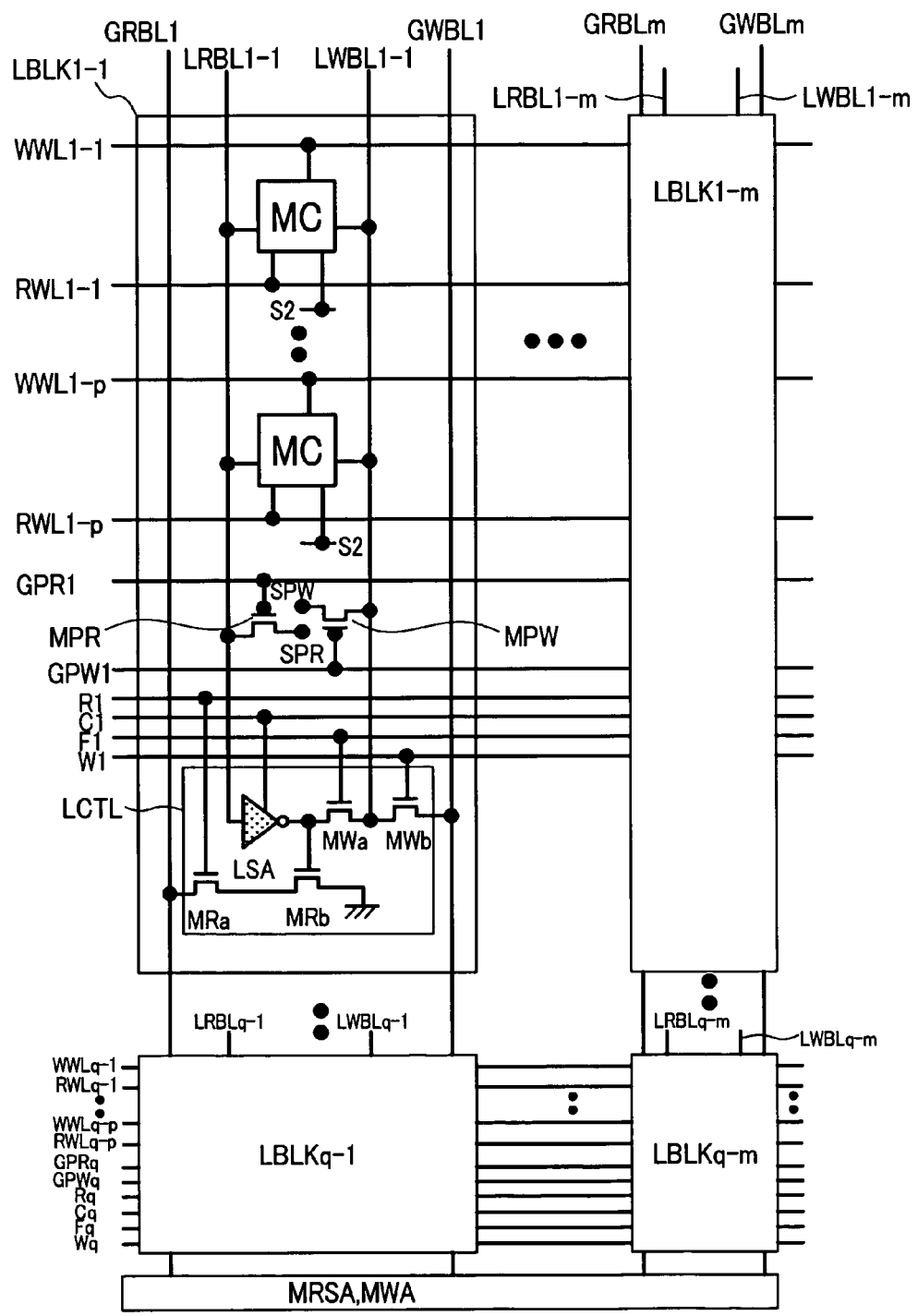
FIG. 17 is a diagram illustrating, as an embodiment, a configuration of a memory array, by which driving only a local bit line makes it possible to perform refresh.

FIG. 17 is a diagram illustrating an embodiment that is suitable for reducing the electric power required for refresh. What was introduced is the embodiment in which the electric current during the standby time can be reduced by interrupting a leakage current flowing to a source of a memory cell. Because the 3-transistor cell is a dynamic cell, refresh is required. Therefore, if not only the source current but also the electric power required for refresh can be reduced, it is possible to realize a memory, the standby electric power of which is very low. As described in the embodiments in FIGS. 9A, 9B and 10, if a transistor, a channel of which is thin, is used as a write transistor, it is possible to improve the retention time. This embodiment provides a method that is suitable for further reducing the electric power required for refresh. In this embodiment, the charge and discharge electric current required for refresh is reduced by dividing a bit line. However, in the case of the 3-transistor cell, in contrast to the 1-transistor cell, read operation and write operation need be performed for refresh. For this reason, as described below, it is necessary to devise a sense circuit, and the like.

In FIG. 17, LBLKi-j (subscripts i, j are integers ranging from 1 to q and from 1 to m respectively) are local blocks each comprising: a local read bit line LRBLi-j and a local write bit line LWBLi-j; memory cells MC connected to them, the number of which is P; a local sense amplifier LSA; and MOS transistors MPR and MPW for precharging the local bit lines. As illustrated in the figure, the local blocks LBLKi-j are two-dimensionally placed, and are connected to one another with global read bit lines GRBL1, . . . , GRBLm, global write bit lines GWBL1, . . . , GWBLm, read word lines RWLi-j, write word lines WWLi-j (subscripts i, j are integers ranging from 1 to q and from 1 to p respectively), and the like. LCTL is a local control circuit. As described below, this circuit is used to control a data flow in response to each of read, write, and refresh operation. It is to be noted that the above local sense amplifier LSA is formed of an inverter by which an input is inverted before it is output. When the potential of a power supply terminal Cj (a subscript j is an integer ranging from 1 to q) becomes high, the local sense amplifier LSA is activated. In addition, in order to keep the diagram from getting complicated, connection wiring of the source electrode S2, and lines indicating the connection of the gate electrode of the MOS transistor used for precharge, are omitted. MRSA and MWA located at one end of the global bit line are a main read sense amplifier and a main write amplifier respectively. The MRSA is a circuit for outputting, to outside the memory array, a signal that is read out on the global read bit line; and the MWA is a circuit for outputting write data to the global write bit line. It is to be noted that in this figure, a decoder, common input/output lines, and the like, are omitted. Operation of this embodiment, mainly about operation of a local control circuit LCTL, will be described with reference to FIG. 18 as below.

Figure 18:
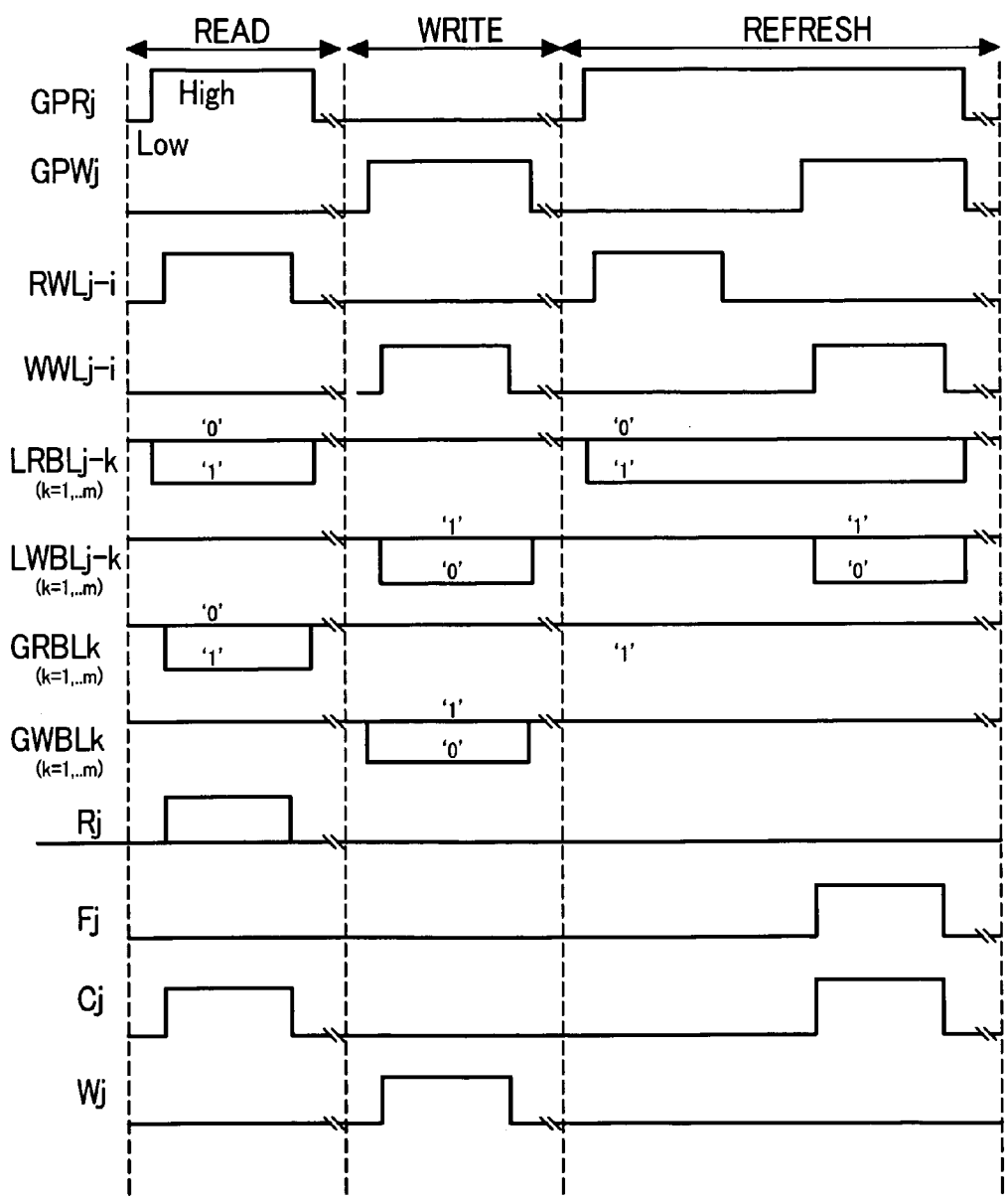
FIG. 18 is a diagram illustrating, as an embodiment, a timing chart of operation in FIG. 17.

FIG. 18 is a diagram illustrating operation waveforms of main parts of Read, Write, and Refresh operation. Incidentally, as is the case with the above embodiment, a horizontal axis indicates the time, and a vertical axis indicates the change in potential. Here, what is taken as an example is operation of a memory cell that is connected to a read word line i and a write word line i in a local block LBLKj-k (a subscript k is an integer ranging from 1 to m). Judging from the property of a memory array, cells on the same word line are selected in parallel. Incidentally, in actual operation, the change in potential is not rectangular as shown in this figure. The finite time is required for rising and falling, and accordingly an angle becomes smooth. However, to make understanding easy, the change in potential is illustrated as a rectangle here. Moreover, as the change in potential, only discrimination between the high potential (High) and the low potential (Low) is indicated. Although a specific voltage level is not shown, it is a matter of course that the voltage level can be individually optimized if necessary. For example, as a voltage applied to a gate of an nMOS transistor, its high potential level is set at a value that is greater than or equal to a voltage obtained by adding a threshold voltage to a maximum value of the source potential.

To begin with, the read operation (Read) will be described. As shown in FIG. 18, a terminal GPRj is brought into the high potential, which causes the pMOS transistor MPR for precharge to be turned OFF. Consequently, the read word line RWLj-i is brought into the high potential. As a result, on the local read bit line LRBLj-k (a subscript k is an integer ranging from 1 to m), a signal is read out from the memory cell MC. If the potential of a storage node of the selected memory cell MC is high, the potential of the local bit line decreases. If the potential of the storage node is low, the high potential is kept at a level of the precharge potential. In the figure, the former example is indicated as '1'; and the latter example is indicated as '0'. Subsequently, terminals Cj and Rj are brought into the high potential to activate the local sense amplifier LSA, which causes the transistor MRa to be turned ON. As a result, a signal inverted by the local sense amplifier LSA is transferred to a gate of the transistor MRb. If the potential of the local read bit line is low, an output of the local sense amplifier becomes the high potential, causing the transistor MRb to be turned ON. As a result, the potential of the global read bit line GRBLk (a subscript k is an integer ranging from 1 to m) becomes the low potential. On the other hand, if the potential of the local bit line is high, an output of the local sense amplifier becomes the low potential, causing the transistor MRb to be turned OFF. In this case, the potential of the global read bit line GRBLk (a subscript k is an integer ranging from 1 to m) is kept at a level of the precharge potential (high potential) (in FIG. 17, a precharge circuit of the global read bit line is omitted). The change in potential of the global bit line occurring in this manner is detected and amplified by the main read sense amplifier MRSA before the amplified change is reads out to the outside of the memory array.

Next, write operation (Write) will be described. A terminal GPWj is brought into the high potential, which causes the pMOS transistor MPW for precharge to be turned OFF. Consequently, the write word line WWLj-i and the terminal Wj are brought into the high potential. As a result, a write transistor (omitted in FIG. 17), and the transistor MWb, of the memory cell are turned ON, and thereby the potential which has been set by the write amplifier WA on the global write bit line GWBLj-k (a subscript k is an integer ranging from 1 to m) is transferred through the local write bit line LWBLj-k (a subscript k is an integer ranging from 1 to m), and is then written to the memory cell.

Lastly, refresh operation will be described. Refresh can be achieved first by inverting, by use of a local sense amplifier, information that is read out on a local read bit line, and then by writing back the information to a memory cell MC through a local write bit line. In the first place, the terminal GPRj is brought into the high potential, which causes the pMOS transistor MPR for precharge to be turned OFF. Consequently, the read word line RWLj-i is brought into the high potential. As a result, on the local read bit line LRBLj-k (a subscript k is an integer ranging from 1 to m), a signal is read out from the memory cell MC. At this time, in contrast to the read operation described above, the potential of the terminal Rj is kept at low potential. While keeping this state unchanged, an input voltage of the local sense amplifier LSA is set at a voltage corresponding to information stored in the memory cell. Subsequently, operation of writing back to a memory cell starts. The terminal GPRj is kept at high potential, and the terminal GPWj is brought into the high potential with the transistor MPR for precharge staying in the OFF state. Then, the transistor MPW for precharging the local write bit line is turned OFF to bring the terminals Cj, Fj and the write word line WWLj-i into the high potential. As a result, the local sense amplifier is activated, and the potential of the local read bit line LRBLj-k (a subscript k is an integer ranging from 1 to m) is inverted through the transistor MWa. Then, the inverted potential is transferred through the local write bit line LWBLj-k (a subscript k is an integer ranging from 1 to m) before it is written to the memory cell MC. Such operation has only to be performed for all memory cells within the retention time. It is to be noted that in the embodiments in FIGS. 15, 16, a differential sense amplifier and a dummy cell are used. As a matter of course, it is also possible to apply a similar circuit to the local sense amplifier in the embodiment shown in FIG. 17. However, a circuit used in the embodiment in FIG. 17 is not differential type, and the number of input of the circuit is one. In this case, if the potential of the read bit line falls to a level lower than a logical threshold value of the inverter circuit, an output changes. Therefore, it is not necessary to use a dummy cell. In addition, because an output of the local sense amplifier is allowed to become large, it is possible to directly drive the local write bit line by the local sense amplifier at the time of refresh. Therefore, it is possible to reduce an area occupied by the local sense amplifier, which is a merit. If a bit line is divided as shown in FIG. 17, an increase in the area may become a problem. In such a case, it is desirable to use a local sense amplifier like this. Incidentally, the logical threshold value can be easily changed by changing a constant, and a threshold value, of a transistor forming the inverter. For example, in the embodiment described above, the local bit line is precharged to the high potential. Accordingly, if a logical threshold value is set at a higher level, it becomes advantageous from the viewpoint of speed.

As described above, according to the embodiments shown in FIGS. 17 and 18, read, write, and refresh operation can be performed in a memory cell array, a bit line of which is divided. With a decrease in the capacity of a bit line to be driven, the electric current consumption of a memory can be more reduced. Therefore, according to this embodiment, a memory with low power consumption can be realized. In particular, because driving only a local bit line enables refresh operation, it is effective to reduce a standby current. Even if this embodiment is independently applied to a memory that uses 3-transistor memory cells, it is needless to say that an effect of reducing the electric current consumption during the refresh can be produced. However, by using this embodiment in combination with the above embodiments in which the leakage current is reduced, it is possible to reduce a standby current to a larger extent.

For example, with the object of improving the retention of a memory cell, the embodiments described in FIGS. 9A and 9B use, as a write transistor, a transistor in which a thin film channel is used. In combination with these embodiments, the frequency of refresh decreases. Accordingly, the embodiments in FIGS. 17 and 18, which produce the effect of reducing the capacity of the bit line to be driven at the time of refresh, make it possible to remarkably reduce the electric current consumption by refresh in combination with the embodiments in FIGS. 9A and 9B. Moreover, in combination with the embodiments in which a leakage current flowing between a source electrode and a read bit line of a 3-transistor cell is reduced as described in the diagrams in FIGS. 1 through 8, and the like, a standby current component excluding refresh is reduced. Accordingly, a memory with little standby current can be realized. As a matter of course, it is also possible to use the above three kinds of embodiments in combination at the same time. More specifically, the three kinds of embodiments are: the embodiment for improving the retention; the embodiment for preventing the leakage current from leaking between a read bit line and a source electrode; and the embodiment as shown in FIGS. 17, 18. In this case, it is possible to realize a memory with extremely low standby electric power.

EXPLANATIONS OF LETTERS OR NUMERALS

In reference numerals listed below, x, y represent numbers, or alphabetical subscripts, used in the figures. For example, RWLx-y represents RWL1-1, RWL1-p, RWLq-p, and the like.
MC: 3-transistor dynamic cell
MR1: Access transistor
MR2: Storage transistor
MW: Write transistor
S2, S2-x: Source electrode of a storage transistor
SN: Information storage node (storage node)
LC, LC-x: Leakage current interruption circuit
XDEC: X decoder
XDRV: X driver
YDEC: Y decoder
YDRV: Y driver
I0: Input/output circuit
RSA, RSAx: Read sense amplifier
WA: Write amplifier
RBL, RBLx: Read bit line
WBL, WBLx: Write bit line
RWL, RWLx, RWLx-y: Read word line
WWL, WWLx, WWLx-y: Write word line
VBP: Read bit line precharge voltage
CH: Channel part OX: Oxide layer
ISO: Isolation region
MSW, MSW1, MSW2: MOS transistor forming a leakage current interruption circuit
MPR: MOS transistor for precharging a read bit line
SPR: Source electrode of the MOS transistor MPR
GPR, GPRx: Gate electrode of the MOS transistor MPR
MPW: MOS transistor for precharging a write bit line
SPW: Source electrode of the MOS transistor MPW
GPW, GPWx: Gate electrode of the MOS transistor MPW
GSW: Control signal of a leakage current interruption circuit
RFCLK: Refresh control clock
ACT, Active: Active state
ST, Standby: Standby state
READ, Read: Read operation
WRITE, Write: Write operation
Refresh: Refresh operation
DMC-H, DMC-Hx: 1 signal generation dummy cell
DMC-L, DMC-Lx: 0 signal generation dummy cell
VDH: Write voltage of 1 signal generation dummy cell
VDL: Write voltage of 0 signal generation dummy cell
DRWL, DRWL-x: Dummy read word line
DWWL, DWWL-x: Dummy write word line
MDx: MOS transistor to which a dummy control signal is inputted
DCTL, DCT-x: Dummy control signal
SIG0: Potential of a read bit line when 0 is read out
SIG1: Potential of a read bit line when 1 is read out
LBLKx-y: Local block
LCTL: Local control circuit
LBLKx-y: Local block
LSA: Local amplifier
MWa, MWb, MRa, MRb: MOS transistor in a local control circuit
LRBLx-y: Local read bit line
LWBLx-y: Local write bit line
GRBLx: Global read bit line
GWBLx: Global write bit line
Rx: Gate terminal of the MOS transistor MRa
Cx: Local amplifier starting signal
Fx: Gate terminal of the MOS transistor MWa
Wx: Gate terminal of the MOS transistor MWb

What is claimed is:

1. A semiconductor integrated circuit comprising:
a memory cell including:
a storage transistor for storing an electric charge in a gate capacitance;
a write transistor for writing the electric charge from a write bit line to a gate electrode of the storage transistor; and
an access transistor for controlling conduction between a read bit line and a drain of the storage transistor; and
a switching element provided between a source electrode of the storage transistor and a power supply potential;
wherein said switching element controls the source electrode of the storage transistor so that in a standby state the source electrode stays in a floating state, and in a read operation state the potential of the source electrode becomes the power supply potential.

2. A semiconductor integrated circuit according to claim 1, having a plurality of said memory cells and further comprising:
a plurality of write word lines extending in a first direction;
a plurality of read word lines extending in the first direction;
a plurality of read bit lines extending in a second direction that intersects the first direction; and
a plurality of write bit lines extending in the second direction;
wherein:
in each of the plurality of memory cells, a gate of the write transistor is connected to one of the plurality of write word lines, one of source/drain terminals of the write transistor is connected to one of the plurality of write bit lines, a gate of the access transistor is connected to one of the plurality of read word lines, one of source/drain terminals of the access transistor is connected to one of the plurality of read bit lines, the other of the source/drain terminals of the write transistor is connected to a gate electrode of the storage transistor, and a drain of the storage transistor is connected to the other of the source/drain terminals of the access transistor.

3. A semiconductor integrated circuit according to claim 2, wherein:
a channel area of the write transistor is formed of a film having a film thickness of about 5 nm or less, said channel area being formed so as to surround a gate electrode of the write transistor through an insulated layer.

4. A semiconductor integrated circuit according to claim 3, wherein:
a source/drain path of the write transistor is formed in a direction perpendicular to a direction in which a source/drain path of the storage transistor is formed.

5. A semiconductor integrated circuit according to claim 3, wherein:
said switching element includes an N-channel MOS transistor having a source/drain path between the power supply potential and a source electrode of the storage transistor.

6. A semiconductor integrated circuit according to claim 2, wherein:
said plurality of memory cells are provided with the switching element in common.

7. A semiconductor integrated circuit comprising:
a memory cell including:
a storage transistor for storing an electric charge in a gate capacitance;
a write transistor for writing the electric charge from a write bit line to a gate electrode of the storage transistor; and
an access transistor for controlling conduction between a read bit line and a drain of the storage transistor; and
a first circuit for changing the potential of a source electrode of the storage transistor in response to a state in which the semiconductor integrated circuit stays, either in a read operation state or in a standby state.

8. A semiconductor integrated circuit according to claim 7, having a plurality of said memory cells and further comprising:
a plurality of write word lines extending in a first direction;
a plurality of read word lines extending in the first direction;
a plurality of read bit lines extending in a second direction that intersects the first direction; and
a plurality of write bit lines extending in the second direction;
wherein:
in each of the plurality of memory cells, a gate of the write transistor is connected to one of the plurality of write word lines, one of source/drain terminals of the write transistor is connected to one of the plurality of write bit lines, a gate of the access transistor is connected to one of the plurality of read word lines, one of source/drain terminals of the access transistor is connected to one of the plurality of read bit lines, the other of the source/drain terminals of the write transistor is connected to a gate electrode of the storage transistor, and a drain of the storage transistor is connected to the other of the source/drain terminals of the access transistor.

9. A semiconductor integrated circuit according to claim 8, wherein:
a channel area of the write transistor is formed of a film having a film thickness of about 5 nm or less, said channel area being formed so as to surround a gate electrode of the write transistor through an insulated layer.

10. A semiconductor integrated circuit according to claim 9, wherein:
a source/drain path of the write transistor is formed in a direction perpendicular to a direction in which a source/drain path of the storage transistor is formed.

11. A semiconductor integrated circuit according to claim 8, wherein:
said first circuit includes an N-channel MOS transistor having a source/drain path between a power supply potential and a source electrode of the storage transistor, said first circuit controlling the source electrode of the storage transistor so that in a first state the source electrode stays in a floating state, and in a second state the potential of the source electrode becomes the power supply potential.

12. A semiconductor integrated circuit according to claim 11, wherein:
said plurality of memory cells are provided with the first circuit in common.

13. A semiconductor integrated circuit comprising:
a memory cell including:
a storage transistor for storing an electric charge in a gate capacitance;
a write transistor for writing the electric charge from a write bit line to a gate electrode of the storage transistor; and
an access transistor for controlling the conduction between a read bit line and a drain of the storage transistor; and
a precharge transistor for charging a read bit line to a desired potential, a first electrode of the precharge transistor is connected to the read bit line, and a potential of a second electrode of the precharge transistor is changed in response to a state in which the semiconductor integrated circuit stays, either in an active state or in a standby state.

14. A semiconductor integrated circuit according to claim 13, having a plurality of said memory cells and further comprising:
a plurality of write word lines extending in a first direction;
a plurality of read word lines extending in the first direction;
a plurality of read bit lines extending in a second direction that intersects the first direction;
a plurality of write bit lines extending in the second direction;
an X decoder for selecting among the plurality of read word lines and the plurality of write word lines; and
a Y decoder for selecting among the plurality of read bit lines and the plurality of write bit lines;
wherein:
in each of the plurality of memory cells, a gate of the write transistor is connected to one of the plurality of write word lines, one of source/drain terminals of the write transistor is connected to one of the plurality of write bit lines, a gate of the access transistor is connected to one of the plurality of read word lines, one of source/drain terminals of the access transistor is connected to one of the plurality of read bit lines, the other of the source/drain terminals of the write transistor is connected to a gate electrode of the storage transistor, and a drain of the storage transistor is connected to the other of the source/drain terminals of the access transistor.

15. A semiconductor integrated circuit according to claim 14, wherein:
a channel area of the write transistor is formed of a film having a film thickness of about 5 nm or less, and is formed so as to surround a gate electrode of the write transistor through an insulated layer.

16. A semiconductor integrated circuit according to claim 15, wherein:
a source/drain path of the write transistor is formed in a direction perpendicular to a direction in which a source/drain path of the storage transistor is formed.

* * * * *